(12) United States Patent
Kaiho et al.

(10) Patent No.: US 7,656,202 B2
(45) Date of Patent: Feb. 2, 2010

(54) DRIVING DEVICE AND DRIVING METHOD

(75) Inventors: Toshio Kaiho, Tokyo (JP); Junichi Machida, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 192 days.

(21) Appl. No.: 11/798,594

(22) Filed: May 15, 2007

(65) Prior Publication Data
US 2007/0290726 A1    Dec. 20, 2007

(30) Foreign Application Priority Data
May 15, 2006    (JP)    ............................. 2006-135596

(51) Int. Cl.
    *H03B 1/00* (2006.01)
(52) U.S. Cl. .................... 327/108; 327/424; 327/112
(58) Field of Classification Search ......... 327/108–112, 327/423, 424, 588
    See application file for complete search history.

(56) References Cited

U.S. PATENT DOCUMENTS

| | | | |
|---|---|---|---|
| 5,672,998 A | 9/1997 | Wittlinger | |
| 5,805,020 A | 9/1998 | Danz et al. | |
| 6,147,545 A * | 11/2000 | Marshall | 327/424 |
| 6,211,728 B1 | 4/2001 | Chen et al. | |
| 6,229,389 B1 | 5/2001 | Pullen et al. | |
| 6,262,632 B1 | 7/2001 | Corsi et al. | |
| 6,614,297 B2 | 9/2003 | Score et al. | |
| 6,690,212 B2 * | 2/2004 | Yamamoto | 327/110 |
| 7,030,663 B2 * | 4/2006 | McCorkle et al. | 327/108 |
| 7,227,408 B2 | 6/2007 | Candy | |
| 7,355,473 B2 | 4/2008 | Wu | |
| 7,463,090 B2 * | 12/2008 | Kaiho et al. | 330/10 |

FOREIGN PATENT DOCUMENTS

JP    2006-203757    8/2006

* cited by examiner

*Primary Examiner*—Long Nguyen
(74) *Attorney, Agent, or Firm*—Finnegan, Henderson, Farabow, Garrett & Dunner, LLP

(57) ABSTRACT

A driving device and driving method for controlling electric power to a load is provided. The driving device controls switching operations of switching elements by setting a first duration in which electric power is supplied to the load and by setting a second duration in which the load is floated without electric power. The driving device feeds back an output signal outputted from output terminals of the load, receives an input signal, and compares the fed back output signal with the input signal to detect an error. The driving device also generates an error suppression signal to correct the detected error and controls the switching operation of the switching elements based on the error suppression signal.

15 Claims, 27 Drawing Sheets

(LOAD-DRIVING STATE 1-a)

(LOAD-DRIVING STATE 1-b)

(LOAD-DRIVING STATE 1-c)

(LOAD-DRIVING STATE 3-a)

(LOAD-DRIVING STATE 3-b)

(LOAD-DRIVING STATE 5-a)

(LOAD-DRIVING STATE 5-b)

(LOAD-DRIVING STATE 5-c)

DRIVING DEVICE AND DRIVING METHOD

This application claims the benefit of Japanese Patent Application No. 2006-135596 filed on May 15, 2006, which is hereby incorporated by reference herein in its entirety.

BACKGROUND OF THE INVENTION

1. Field of the Invention

The present invention relates to a driving device and driving method for driving a load such as a piezoelectric speaker as a capacitive device.

2. Description of the Related Art

A piezoelectric speaker mounted in an information apparatus, such as a mobile telephone, is characterized by being thin, light, and low power consumption. If sound quality is improved and price is lowered, the piezoelectric speaker may be popularized. However, in the present conditions, a capacitive device such as a piezoelectric speaker is a capacitive load for a driving circuit, and there is no optimal driving method for driving a capacitive device.

In contrast, an inductive device, such as a dynamic speaker, is generally used as an inductive load in a driving circuit. The driving circuit is configured to be suitable for the inductive load. In particular, when a driving circuit is incorporated in a mobile device, the inductive device is generally driven by a battery. A switching amplifier (class D amplifier) having high electric-power efficiency is suitable for long time use.

FIGS. 19 and 20 are circuit diagrams showing a load-driving state of a conventional switching amplifier. FIG. 19 shows load-driving states 3-$a$ and FIG. 20 shows load-driving states 3-$b$.

FIG. 21 is a waveform diagram shows respective signals according to the driving circuit of FIGS. 19 and 20 in the case that the duty ratio of a pulse modulation output is 50%. The characters in FIG. 21 correspond to the characters'respective positions in FIGS. 19 and 20.

The load-driving state 3-$a$ in FIG. 19 is performed during duration T4$a$. Transistors 20 and 23 are turned ON and transistors 21 and 22 are turned OFF. The value at OUTP becomes VCC-level and the value at OUTN becomes GND-level. The potential difference VL1 across an inductive load L1 becomes +VCC. Then, a current I flows through the inductive load L1 from OUTP to OUTN.

The load-driving state 3-$b$ in FIG. 20 is performed during duration T4$b$. Transistors 20 and 23 are turned OFF and transistors 21 and 22 are turned ON. The value of OUTP becomes GND-level and the value of OUTN becomes VCC-level. The potential difference VL1 across the inductive load L1 becomes –VCC. Then, the current I flows through the inductive load L1 from OUTN to OUTP.

In the above driving method, the duty ratio of the pulse modulation output becomes 50% at the time of a no-input-signal period that no electric power needs to be supplied to the inductive load L1. Then, the ripple of the current I that flows through the inductive load L1 becomes highest, thus largely producing wasteful current.

FIGS. 22 to 27 show improved examples of a switching amplifier having a driving method in which wasteful current consumption is reduced (refer to U.S. Pat. Nos. 6,614,297, 6,211,728, and 6,262,632).

FIGS. 22 to 27 are circuit diagrams and waveforms showing load-driving states of the switching amplifier.

As shown in the signal waveforms of FIGS. 26 and 27, in such a switching amplifier, a voltage across load terminals is applied during the duration that electric power is required, but connection of load terminals is short-circuited so as to make the applied voltage to be zero volts during the duration that no electric power is required, thus controlling an output waveform.

A load-driving state 5-$a$ shown in FIG. 22, a load-driving state 5-$b$ shown in FIG. 23, a load-driving state 5-$c$ shown in FIG. 24, and a load-driving state 5-$d$ shown in FIG. 25 are configured so as to reduce a ripple current during load driving is reduced.

FIGS. 26 and 27 are waveform diagrams showing signals according to respective positions of the driving circuit shown in FIGS. 22 to 25. The reference characters in FIGS. 26 and 27 correspond to the reference characters in FIGS. 22 and 25.

The load-driving state 5-$a$ in FIG. 22 is represented in duration T6$a$ in FIG. 26. Transistors 20 and 23 are turned ON and transistors 21 and 22 are turned OFF. The value of OUTP becomes VCC-level and the value of OUTN becomes GND-level. The electric-potential difference VL1 across the inductive load L1 becomes +VCC. Then, the current I flows through the inductive load L1 from OUTP to OUTN.

The load-driving state 5-$b$ in FIG. 23 is represented in duration T6$b$ in FIG. 27. Transistors 20 and 23 are turned OFF and transistors 21 and 22 are turned ON. The value of OUTP becomes GND-level and the value of OUTN becomes VCC-level. The electric-potential difference VL1 across the inductive load L1 becomes –VCC. Then, the current I flows through the inductive load L1 from OUTN to OUTP.

The load-driving state 5-$c$ in FIG. 24 is represented in duration T6$c$ of FIG. 26 or FIG. 27. Transistors 21 and 23 are turned ON and transistors 20 and 22 are turned OFF. The values of OUTP and OUTN become GND-level. The electric-potential difference VL1 across the inductive load L1 becomes zero (GND). Then, the current I flows through the inductive load L1 from OUTP or OUTN to the ground. That is, energy accumulated in the inductive load L1 is discharged.

The load-driving state 5-$d$ in FIG. 25 is represented in duration T6$d$ in FIG. 26 or FIG. 27. Transistors 21 and 23 are turned OFF and transistors 20 and 22 are turned ON. The values of OUTP and OUTN become VCC-level. The electric-potential difference VL1 across the inductive load L1 becomes zero (GND). Then, the current I flows from OUTN or OUTP to the power source. That is, energy accumulated in the inductive load L1 is discharged.

In other words, when the value of OUTP is higher than that of OUTN in the signal component excluding the switching frequency component and harmonic components applied across terminals of the inductive load L1, driving is performed in such a signal waveform, as a timing chart 6-$a$ shown in FIG. 26, such that durations T6$c$ and T6$d$ that no energy is supplied exist before and after the duration T6$a$ that a current as energy is supplied from OUTP to OUTN.

Similarly, when the value of OUTN is higher than that of OUTP in the signal component excluding the switching frequency component and harmonic components applied across terminals of the inductive load L1, driving is performed in such a signal waveform as a timing chart 6-$b$ shown in FIG. 27, such that the durations T6$c$ and T6$d$ that no energy is supplied exist before and after the duration T6$b$ that a current as energy is supplied from OUTN to OUTP.

However, when a piezoelectric speaker as a capacitive device is driven by use of the above driving method, a connection between load terminals is short-circuited for a duration that electric charge should be retained. Thus, the accumulated electric charge is lost, and the voltage across the load is lowered. In the next power-supply duration, another charge corresponding to the lost charge is additionally supplied in order to compensate for the lost charge, thus consuming electric power overly. That is, the above driving method produces reactive power and cannot obtain the advantage of low power consumption in a piezoelectric speaker.

SUMMARY OF THE INVENTION

Therefore, an object of the present invention is to provide a driving device and a driving method in which an output signal having a waveform including high reproducibility can be outputted in contrast to an input signal.

In addition, another object of the present invention is to provide a driving device and a driving method in which reactive power can be reduced and low power consumption can be achieved, even in the case that the driving device is configured as a switching amplifier and drives a capacitive load.

According to one embodiment of the present invention, there is provided a driving device for controlling electric power to a load by using switching elements; the driving device comprising: a driving means having a switching circuit including a plurality of switching elements connected to the load; and a control means for controlling switching operations of the plurality of switching elements, wherein the control means sets a first duration that electric power is supplied to the load and a second duration that the load is floated without electric power.

According to an embodiment of the present invention, each of the switching elements has a first terminal connected to any one of the terminals of the load, a second terminal to which a switching control signal is inputted, and a third terminal connected to a power-source terminal or a ground terminal; the control means, within one period of the switching control signal, has the first duration that electric power is supplied to the load such that one terminal of the load is connected to the power-source terminal and the other terminal of the load is connected to the ground terminal, and the second duration that no electric power is supplied to the load such that terminals of the load are floated.

Preferably, each of the switching elements has a first terminal connected to any one of the terminals of the load, a second terminal to which a switching control signal is inputted, and a third terminal connected to a power-source terminal or a ground terminal; the control means, within one period of the switching control signal, has the first duration that electric power is supplied to the load such that one terminal of the load is connected to the power-source terminal and the other terminal of the load is connected to the ground terminal, and the second duration that no electric power is supplied to the load such that one terminal of the load is connected to the power-source terminal or the ground terminal and the other terminal of the load is floated.

Preferably the present invention further comprises: a first feedback means for feeding back an output signal across output terminals of the load to an input terminal inputted an input signal; and an error suppression means, connected to the input terminal, comparing the output signal fed back through the first feedback means with the input signal to detect an error between signals and producing an error suppression signal that the error is corrected, wherein the control means controls the operation of the plurality of switching elements in the driving means based on the error suppression signal.

Preferably, in accordance with the absolute value of the error suppression signal, the control means alters a proportion of the first duration that electric power is supplied to the load to the second duration that the load is floated without electric power.

Preferably, the control means supplies electric power only from a positive-polarity output terminal of the load during a duration that the polarity of an output signal at output terminals of the load is positive, and supplies electric power only from a negative-polarity output terminal of the load during a duration that the polarity of the output signal is negative.

Preferably, the control means includes a triangular-wave generation means producing a triangular wave, a comparing means comparing the triangular wave with the error suppression signal, and a control signal generation means producing a control signal for controlling a driving circuit based on output from the comparing means.

The present invention may further comprise: a second feedback means for detecting an inclination component of the error suppression signal and feeding back the inclination component to the error suppression means, wherein the error suppression means generates another error suppression signal based on a comparison between the input signal and the inclination component.

Preferably, the driving means is directly connected to the load.

Preferably, the load is a capacitive load.

Preferably, the load is a piezoelectric speaker.

In yet another embodiment, the present invention comprises: a driving device for controlling electric power to a load by using switching elements; an information processing portion, having a communication function and an information processing function, for controlling the driving device; and a battery supplying electric power to the driving device and the information processing portion.

Still another embodiment of the present invention takes the form of a driving method controlling electric power to a load by using switching elements, the method comprising: a first duration that the operations of the switching elements are switched to supply electric power to the load and a second duration that the load is floated without electric power.

Preferably, a proportion of the first duration that electric power is supplied to the load to the second duration that the load is floated without electric power is altered.

Preferably, electric power is supplied only from a positive-polarity output terminal of the load in a duration that the polarity of an output signal at the terminals of the load is positive, and electric power is supplied only from a negative-polarity output terminal of the load in a duration that the polarity of the output signal is negative.

Another embodiment of the present invention includes the steps of comparing an output signal at the output terminals of the load with an input signal to produce the error between signals; producing a first or second error suppression signal corresponding to the error between the detected signals; and altering the proportion of a first duration that electric power is supplied to the load to a second duration that the load is floated without electric power according to the error amount in the error suppression signal. Thus, even when the driving device is configured as a conventional switching amplifier, a waveform of the output signal having high reproducibility contrast to an input signal can be outputted from the load in the driving device, thereby enhancing the sound quality of a speaker.

Moreover, according to an embodiment the present invention, the proportion of a first duration that electric power is supplied to the load to a second duration that the load is floated without electric power can be controlled according to the error amount in the first or second error suppression signal. Thus, the low-consumption drive of a load, such as a capacitive piezoelectric speaker, can be performed to obtain low power consumption in the driving circuit including the load. Accordingly, the present invention is suitably applied, for example, to a speaker driving device in an information apparatus such as a battery-driven mobile telephone.

Further features of the present invention will become apparent from the following description of exemplary embodiments (with reference to the attached drawings).

BRIEF DESCRIPTION OF THE DRAWINGS

FIG. 5 is a circuit diagram explaining the path that current flows through a capacitive load when a driving circuit is ON;

FIG. 6 is a circuit diagram explaining the path that current flows through capacitive load in the reverse direction contrast to FIG. 5 when a driving circuit is ON;

DESCRIPTION OF THE EMBODIMENTS

Hereinafter, embodiments of the present invention will be explained in detail, with reference to the accompanying drawings.

FIRST EXAMPLE

A first embodiment of the present invention will be described with reference to FIGS. 1 to 13.

An example will be explained in the case that a driving device according to the present invention is configured as a switching amplifier (class D amplifier) including a capacitive load, such as a piezoelectric speaker, as a load.

(Circuit Configuration)

Figure 1:
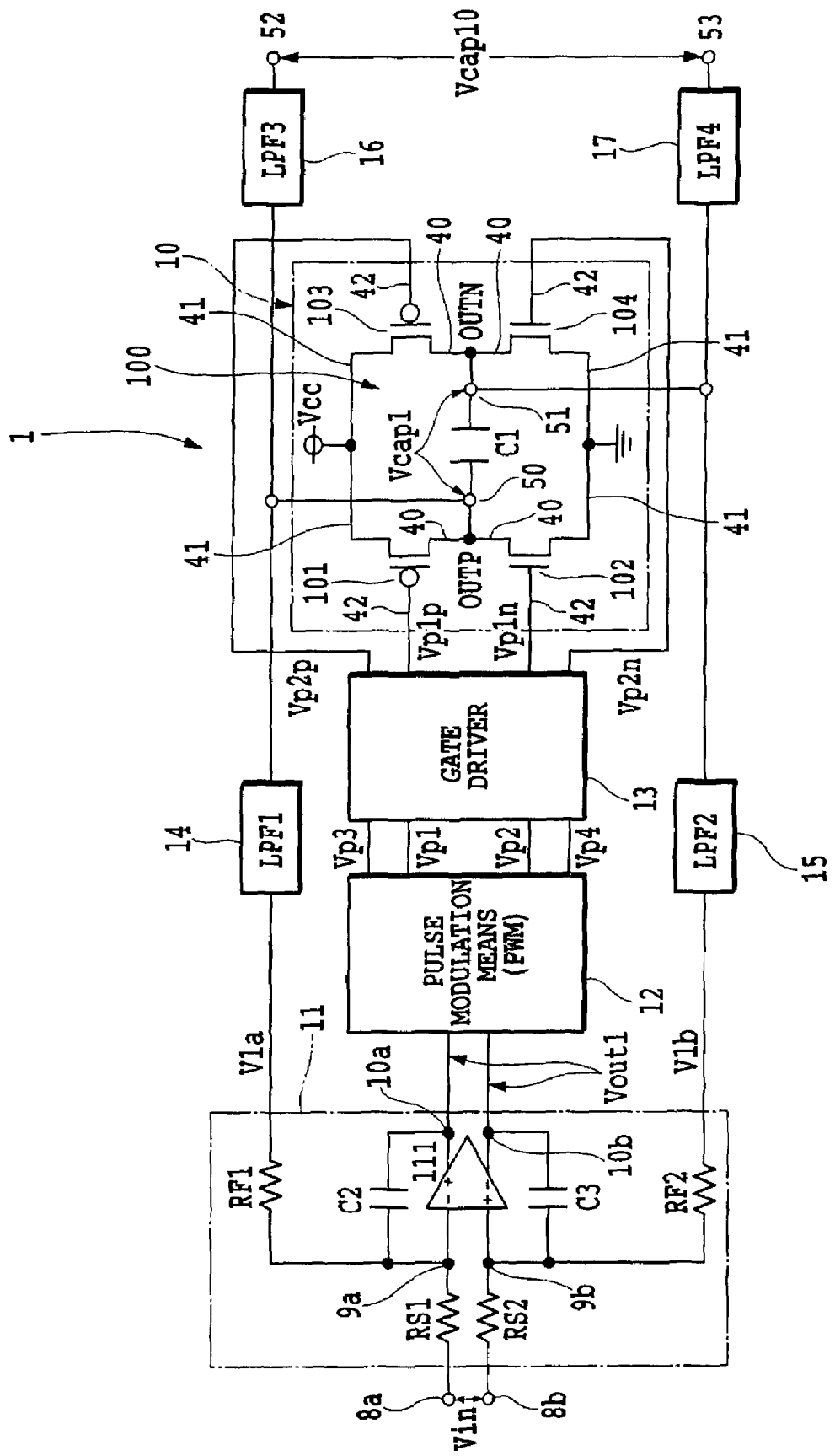
FIG. 1 is a circuit diagram showing an exemplary configuration of a driving device constituted of a switching amplifier, according to a first embodiment of the present invention.

FIG. 1 shows a driving device 1 configured as a switching amplifier.

The driving device 1 includes a driving circuit 10 outputting an output signal Vcap1, an error suppression circuit 11 producing a first error suppression signal Vout1, a pulse width modulation circuit (PWM) 12, as a pulse modulation means, outputting switching control signals Vp1, Vp2, Vp3, and Vp4 as pulse modulation signals, a gate driver 13, and low pass filters (LPF1 and LPF2) 14 and 15 as first feedback means.

The configuration of each portion will be explained.

The driving circuit 10 has a switching circuit 100 including a plurality of switching elements 101, 102, 103, and 104, a capacitive load C1 as load is connected between connection points OUTP and OUTN in the driving circuit 10.

Each of the switching elements 101, 102, 103, and 104 (each one is a transistor such as a MOSFET) has a first terminal 40 (the connection point OUTP or OUTN) connected to one output terminal 50 of the capacitive load C1, a second terminal 41 connected to the power source (Vcc) or the ground terminal, and a third terminal 42 that one of the switching control signals Vp1p, Vp1n, Vp2p, and Vp2n is inputted.

The switching circuit 100 controls ON/OFF behavior of the switching elements 101, 102, 103, and 104 based on the switching control signals Vp1p, Vp1n, Vp2p, and Vp2n to control the power supply to the capacitive load C1. An output signal Vcap1, which is a voltage across the terminals of the capacitive load C1, is produced between the output terminals 50 and 51 that are provided at the connection points (OUTP, OUTN) between the terminal of the capacitive load C1 and the first terminals 40 of the switching elements 101, 102, 103, and 104.

The low pass filters (LPF1 and LPF2) 14 and 15 feeds back the output signal Vcap1 produced between the output terminals 50 and 51 of the driving circuit 10 through feedback resistors RF1 and RF2 of the error suppression circuit 11 to the terminals 9a and 9b. Here, output signals V1a and V1b are used as the fed-back signals.

The error suppression circuit 11 is configured as an integrator including a differential amplifier circuit 111, a capacitor C2 connected between the terminal 9a and a terminal 10a, a capacitor C3 connected between the terminal 9b and a terminal 10b, input resistors RS1 and RS2 connected between an input terminal 8a and the terminal 9a and between an input terminal 8b and the terminal 9b respectively, and the feedback resistors RF1 and RF2 connected to the terminals 9a and 9b respectively.

The error suppression circuit 11 compares the amplitudes of the output signals V1a and V1b fed back through the low pass filters (LPF1 and LPF2) 14 and 15 with the amplitude of an input signal Vin inputted to the input terminals 8a and 8b, and then detects the error of amplitudes between signals. In order to suppress the detected error of amplitudes between signals, a voltage that the error is corrected (the first error suppression signal Vout1) is produced. Here, the processing is performed not discretely but continuously. In this case, the input signal Vin is a differential signal or a single-ended input signal that the input terminal 8a or 8b is connected to a reference signal level.

Further, the error suppression circuit 11 may be configured as a single-ended structure. In the case of the single-ended structure, connection points (OUTP, OUTN) as differential output is changed to a single-ended terminal and the single-ended terminal may be fed back to the error suppression circuit 11.

Furthermore, the driving circuit 10 may be configured as a full-bridge configuration or a half-bridge configuration. In the case of the half-bridge configuration, one terminal of the capacitive load C1 is grounded, the driving circuit 10 is configured with two switching elements 101 and 102 (or 103 and 104).

In the present embodiment, in FIG. 1, in order to evaluate input reproducibility of the switching amplifier, for the sake of convenience, low pass filters (LPF3 and LPF4) 16 and 17 are connected to the output terminals 50 and 51 of the driving circuit 10, and an output signal Vcap10 is outputted from the respective output terminals 52 and 53 of the low pass filters (LPF3 and LPF4) 16 and 17. Further, the low pass filters (LPF3 and LPF4) 16 and 17 may not be incorporated in the driving device 1, and there is no relationship with operation of the switching amplifier.

Figure 2A:
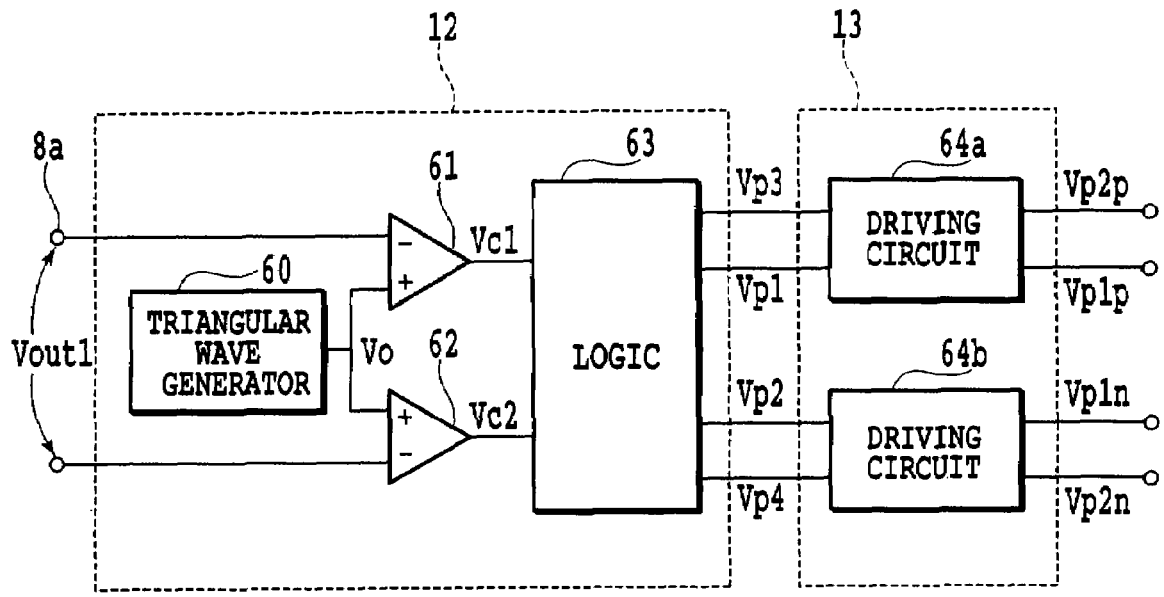
FIG. 2A is a circuit diagram showing the configurations of a pulse modulation means and a gate driver.

FIG. 2A shows the internal configurations of the pulse width modulation circuit (PWM) 12 and the gate driver 13.

The pulse width modulation circuit (PWM) 12 is configured with a triangular wave generator 60, two comparators 61 and 62, and a logic circuit (LOGIC) 63. The triangular wave generator 60 produces a triangular wave as a reference signal. The produced triangular wave is inputted to the comparators 61 and 62. The logic circuit (LOGIC) 63 outputs the signals Vp1, Vp2, Vp3, and Vp4 to the gate driver 13 based on comparison-result signals Vc1 and Vc2 from the comparators 61 and 62, respectively.

Figure 2B:
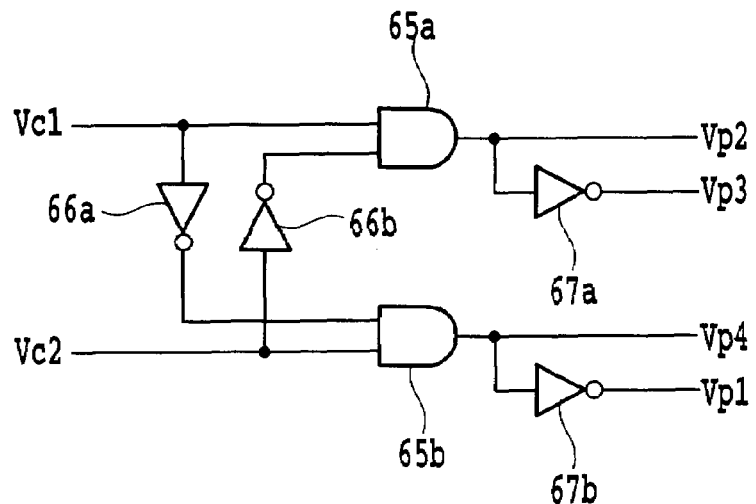
FIG. 2B is an explanatory diagram showing the configuration of an arithmetic circuit (LOGIC)

FIG. 2B shows an example of a specific circuit for the logic circuit (LOGIC) 63. An AND circuit 65a receives the comparison-result signal Vc1 and a signal processed by inverting the comparison-result signal Vc2 by an inverter 66b, and outputs the signal Vp2. An inverter 67a outputs the signal Vp3 processed by inverting the signal Vp2. An AND circuit 65b receives the comparison-result signal Vc2 and a signal processed by inverting the comparison-result signal Vc1 by an inverter 66a, and outputs the signal Vp4. An inverter 67b outputs the signal Vp1 processed by inverting the signal Vp4.

The gate driver 13 is configured with driving circuits 64a and 64b. The driving circuits incorporate buffers respectively, and output switching control signals Vp1p, Vp1n, Vp2p, and Vp2n processed by buffering the signals Vp1, Vp2, Vp3, and Vp4.

In addition, in this example, the load is not limited to a capacitive load C1 but an inductive load can also be used.

(Circuit Operation)

In the first place, the outline of the operation of the driving device 1 will be explained.

Figure 3:
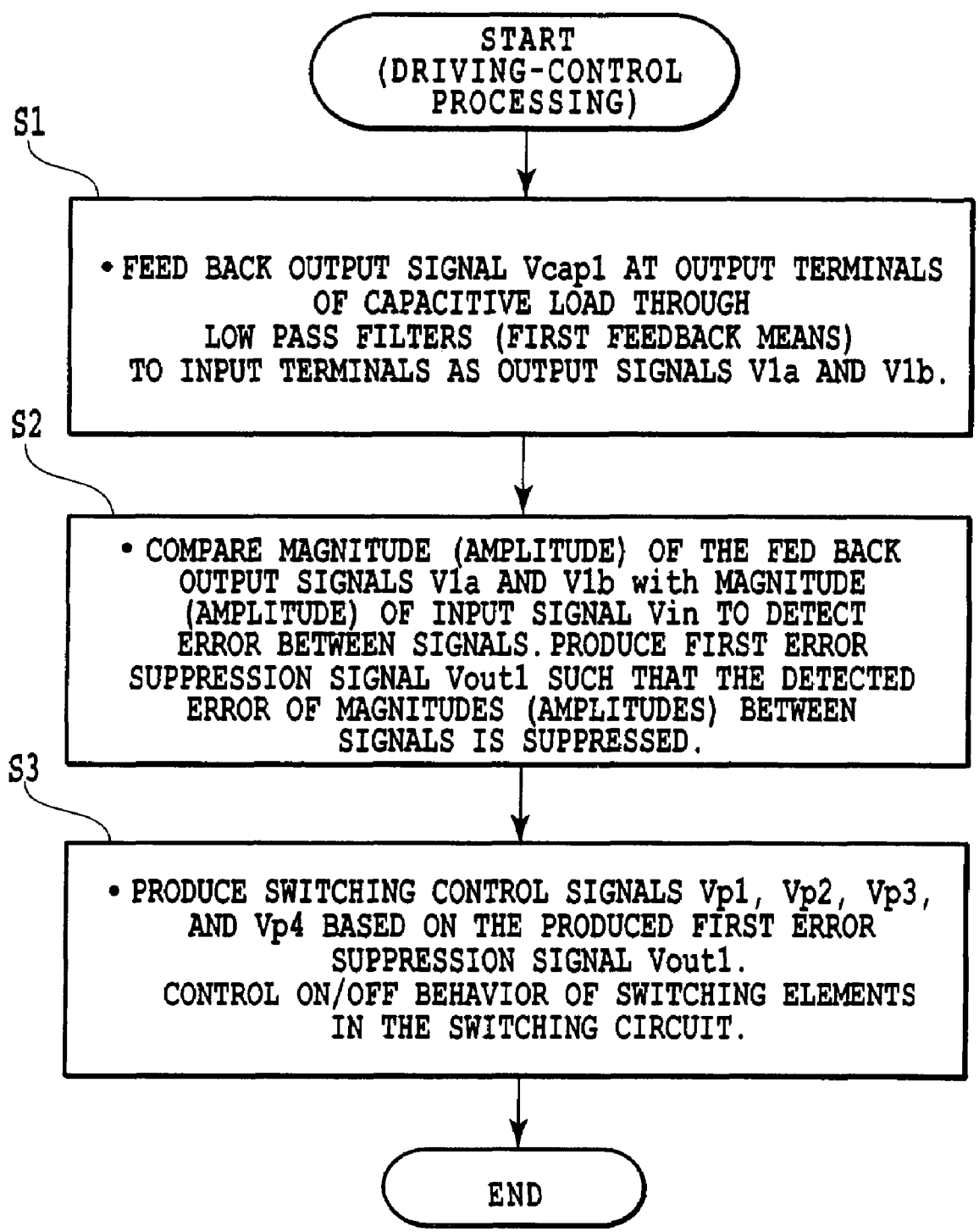
FIG. 3 is a flowchart explaining the basic circuit operation of a driving device.

FIG. 3 is a flowchart explaining the basic circuit operation of the driving device 1.

In step S1, the output signal Vcap1 is produced between the output terminals 50 and 51 as the connection point between the capacitive load C1 and the first terminal 40 of each of the switching elements 101, 102, 103, and 104. The output signal Vcap1 is fed back through the low pass filters (LPF1 and LPF2) 14 and 15 to the input terminals 9a and 9b as the output signals V1a and V1b. The voltage values of the output signals V1a and V1b are charged in the capacitors C2 and C3 of the differential amplification circuit 111.

In step S2, the magnitudes (amplitudes) of the fed back output signals V1a and V1b and the magnitude (amplitude) of the input signal Vin are compared to detect the error between the respective magnitudes (amplitudes) between signals. The first error suppression signal Vout1 is produced so as to suppress the detected error between the signal amplitudes.

In step S3, based on the produced first error suppression signal Vout1, the switching control signals Vp1, Vp2, Vp3, and Vp4 as pulse-modulated signals whose pulse widths are modulated are produced by the pulse width modulation circuit (PWM) 12. The produced switching control signals Vp1, Vp2, Vp3, and Vp4 are inputted through the gate driver 13 to the third terminals 42 of the switching elements 101, 102, 103, and 104. Thus, ON/OFF behavior of the switching elements 101, 102, 103, and 104 can be performed so as to control the supply of current I to the capacitive load C1.

The details of the operation of the driving device 1 will be explained below.

Figure 4:
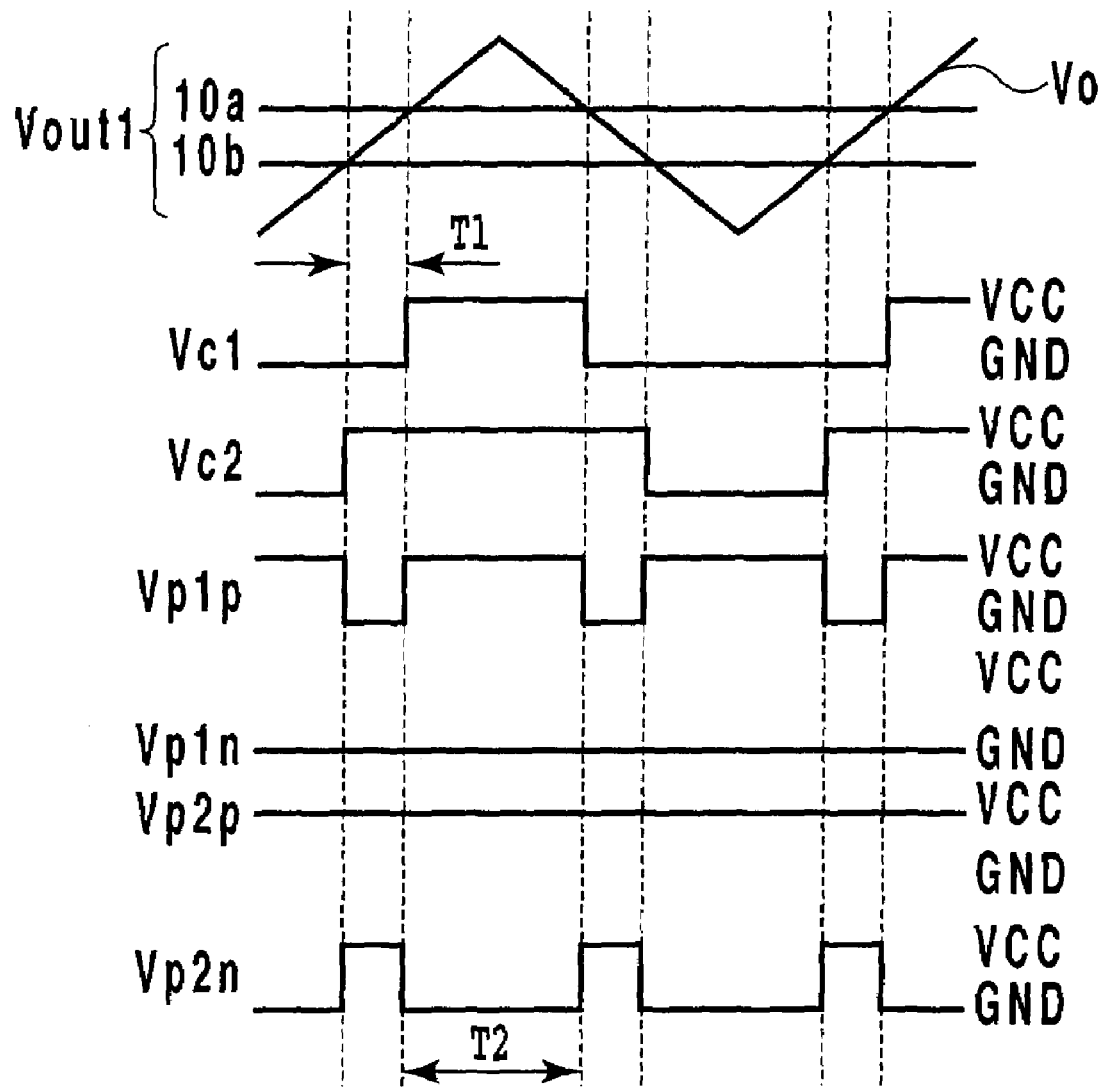
FIG. 4 is a timing chart for the waveforms of signals outputted from the pulse width modulation circuit (PWM) 12 and the gate driver 13.

FIG. 4 is a timing chart showing the waveforms of signals outputted from the pulse width modulation circuit (PWM) 12 and the gate driver 13 shown in FIG. 1.

The pulse width modulation circuit (PWM) 12 compares the first error suppression signal Vout1 produced from the terminals 10a and 10b of the error suppression circuit 11 with a triangular wave V0 as the reference signal. As a result of the comparison, the pulse modulation signals Vp1, Vp2, Vp3, and Vp4 are outputted.

In the gate driver 13, the pulse modulation signals Vp3 and Vp1 are buffered by the driving circuit 64a and outputted as the switching control signals Vp1p and Vp1n. The transistors 101 and 102 are controlled based on the switching control signals Vp1p and Vp1n. Similarly, in the gate driver 13, the pulse modulation signals Vp2 and Vp4 are buffered by the driving circuit 64b and outputted as the switching control signals Vp2p and Vp2n. The transistors 103 and 104 are controlled based on the switching control signals Vp2p and Vp2n.

When the comparison-result signals Vc1 and Vc2 from the comparators 61 and 62 are GND-level (Low) and VCC-level (High) during duration T1 respectively, the switching control signals Vp1p and Vp2n are GND-level (Low) and VCC-level (High) respectively, and the switching control signals Vp1n and Vp2p are GND-level (Low) and VCC-level (High) respectively. In this situation, the transistors 101 and 104 are turned ON and the transistors 102 and 103 are turned OFF. Thus, the control is performed so as to supply the current I to the capacitive load C1. In the case, the switching control signals Vp1p and Vp2n operate complementarily to each other and the switching control signals Vp1n and Vp2p operate complementarily to each other.

Similarly, when the comparison-result signals Vc1 and Vc2 from the comparators 61 and 62 are respectively VCC-level (High) and GND-level (Low) during another duration (not shown), the switching control signals Vp1p and Vp2n are respectively VCC-level (High) and GND-level (Low), and the switching control signals Vp1n and Vp2p are respectively VCC-level (High) and GND-level (Low). In this situation, the transistors 101 and 104 are turned OFF and the transistors 102 and 103 are turned ON. Thus, the control is performed so as to supply the current I to the capacitive load C1.

In contrast, when the comparison-result signals Vc1 and Vc2 from the comparators 61 and 62 are VCC-level (High) or GND-level (Low) during duration T2, the switching control signals Vp1p and Vp2n are VCC-level (High) and GND-level (Low), respectively, and the switching control signals Vp1n and Vp2p are respectively GND-level (Low) and VCC-level (High). In this situation, the transistors 101, 102, 103, and 104 are turned OFF and current I is not supplied to the capacitive load C1. Thus, the capacitive load C1 becomes the state of floating.

Here, the reason why a so-called dead time is unnecessary is that the control is performed such that the load becomes the state of floating during duration that no electric power is supplied to the load. That is, there is no duration that the transistors 101 (103) and 102 (104) are simultaneously turned ON in the process that the driving state transits, whereby no penetrating current flows.

<Load-Driving State>

Figure 5:
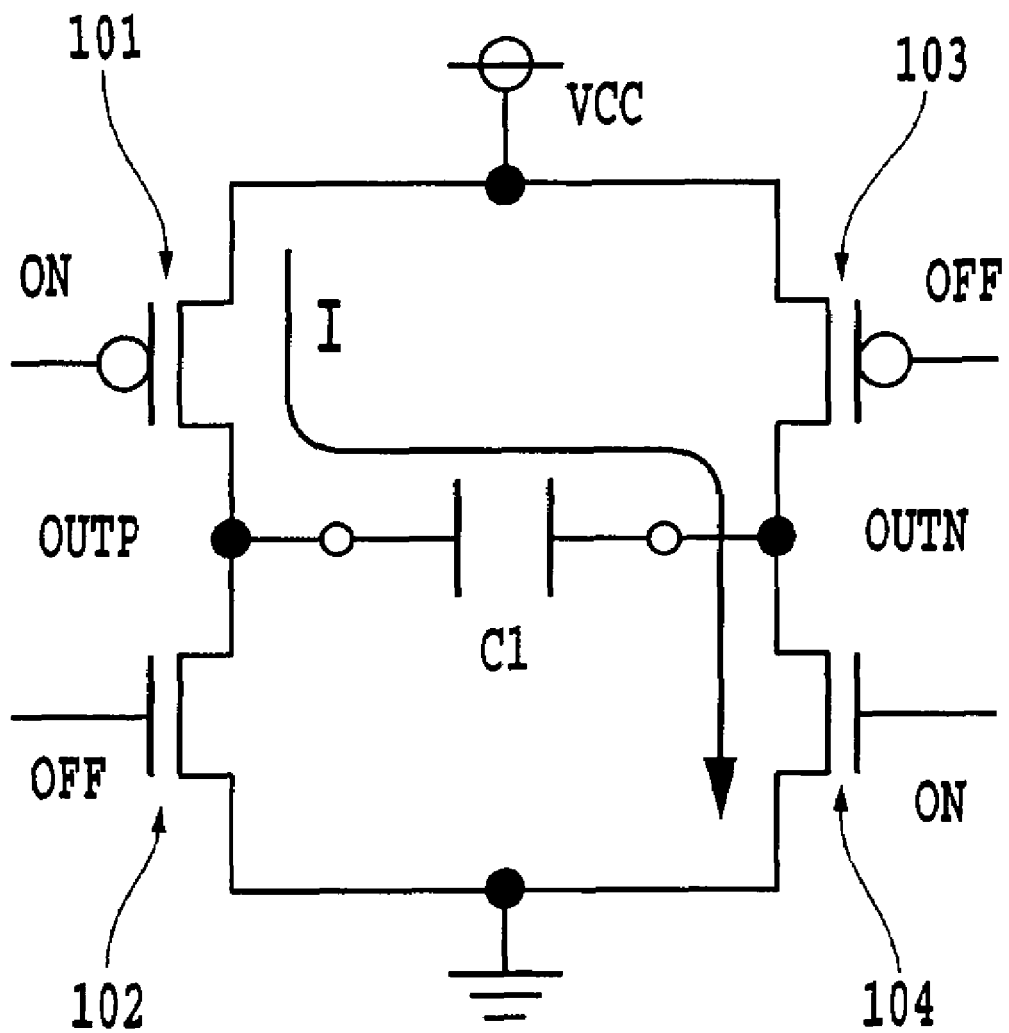
Figure 6:
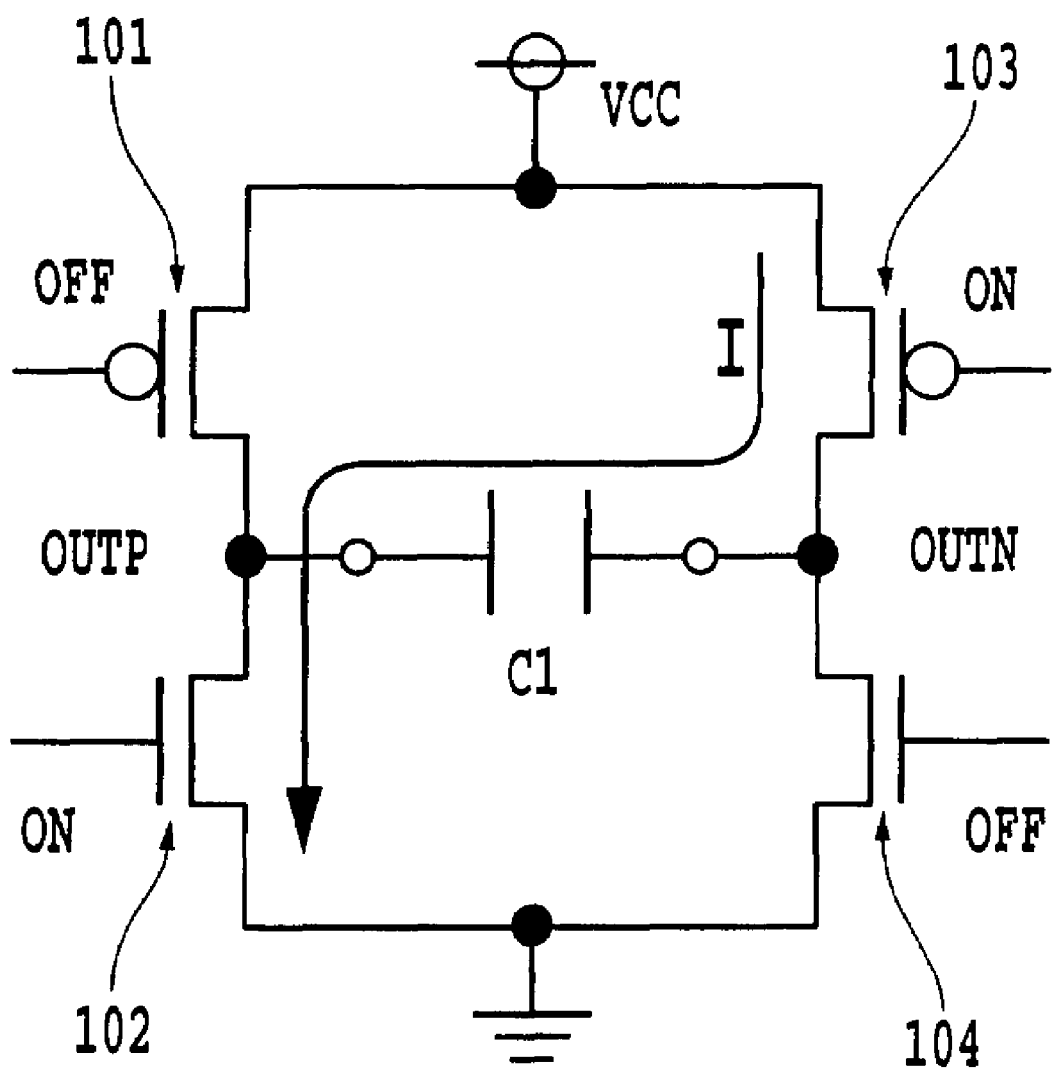
Figure 7:
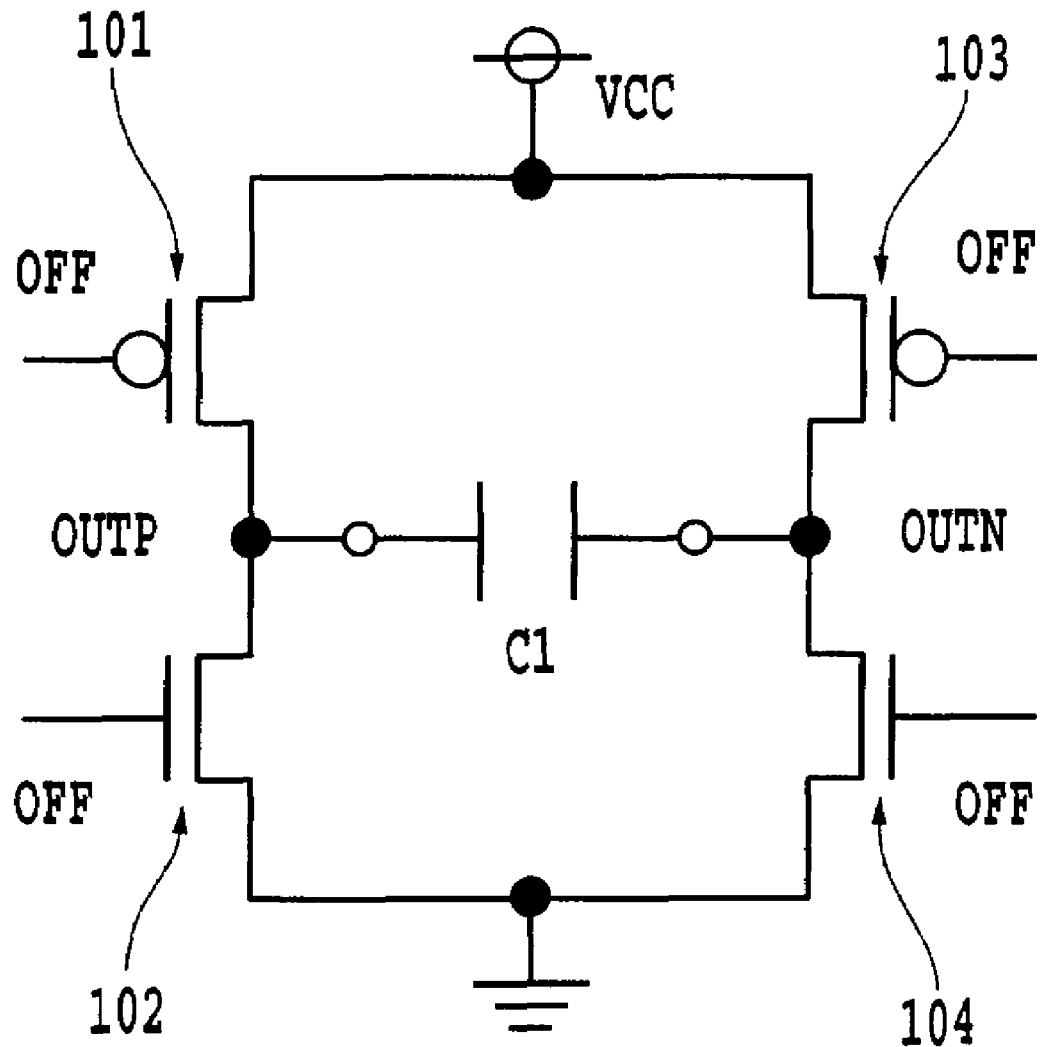
FIG. 7 is a circuit diagram explaining a case that no current flows through a capacitive load when a driving circuit is floating.

FIGS. 5 to 7 are circuit diagrams showing a driving method having three load-driving states.

The load-driving states for driving the capacitive load C1 are a load-driving state 1-a shown in FIG. 5, a load-driving state 1-b shown in FIG. 6, and a load-driving state 1-c shown in FIG. 7.

Figure 8:
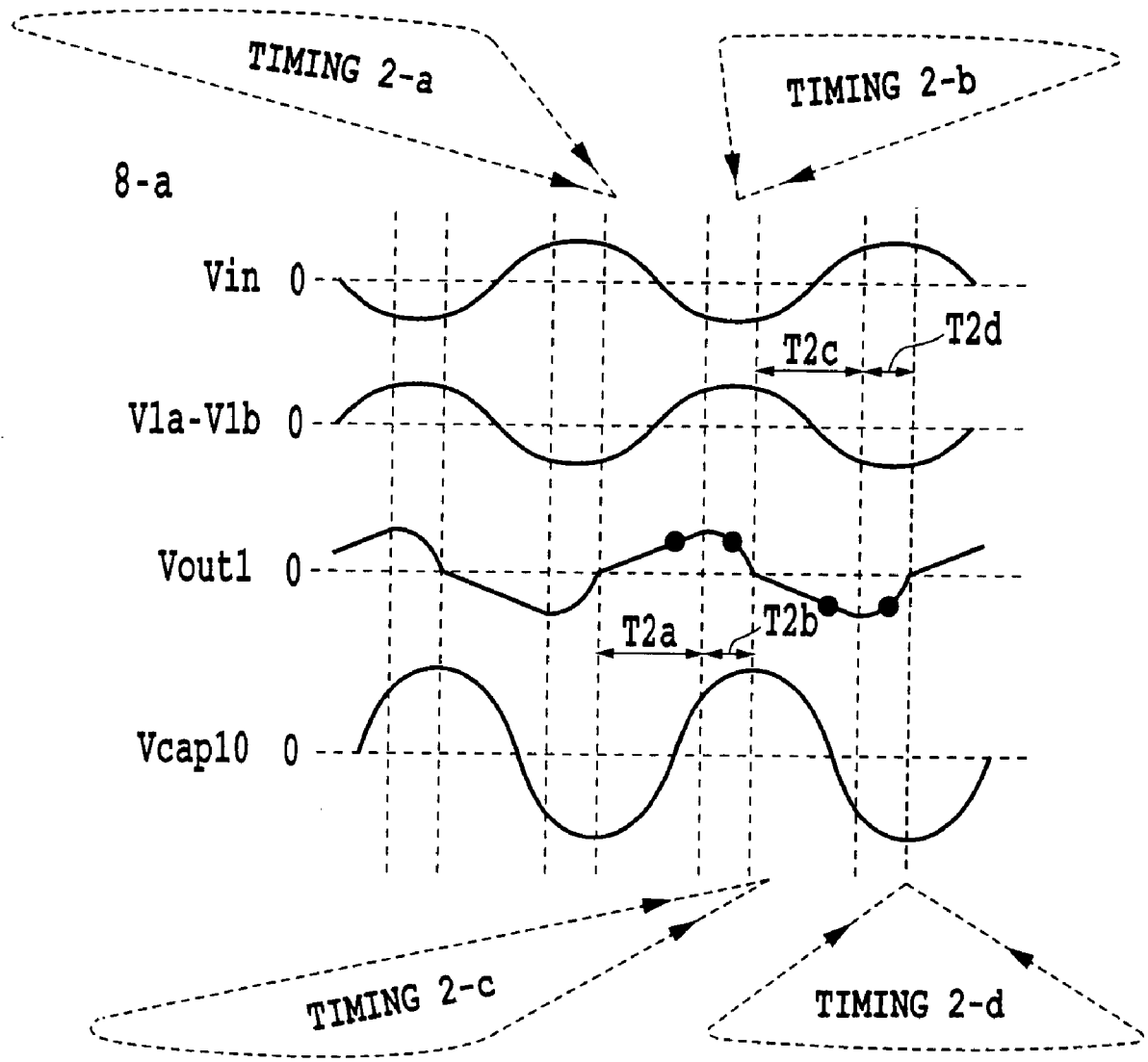
FIG. 8 is a waveform diagram showing waveforms of signals produced by the circuit of a driving device.

FIG. 8 is a chart showing respective waveforms of signals produced by the circuit of driving device 1.

In this case, the duty ratios of the switching control signals Vp1, Vp2, Vp3, and Vp4 are altered in proportion to the first error suppression signal Vout1 as a voltage so as to suppress the detected error of magnitudes (amplitudes) between signals of step S2. Thus, power supply is controlled for the capacitive load C1.

In FIG. 8, Vcap10 shows a waveform outputted from the low pass filters 16 and 17. This waveform is produced such that the switching frequency components and its harmonic components contained in the output signal Vcap1 are removed. The output signal Vcap1 is a voltage across the output terminals 50 and 51 for the driving circuit outputs OUTP and OUTN which are connected to the capacitive load C1. The waveform is used for evaluating the reproducibility to an input in the switching amplifier.

FIGS. 9 to 12 are waveform diagrams showing the outputs OUTP and OUTN, the output signal Vcap1 across the terminals, and the current I through the capacitive load C1.

Vp indicates the electric potential in the case that the terminal of the capacitive load C1 connected to the output OUTP is floating. Vn indicates electric potential in the case that the terminal of the capacitive load C1 connected to the output OUTN is floating. Vp-Vn indicates electric potential charged in the capacitive load C1. Icap indicates a current that flows through the capacitive load C1.

Figure 9:
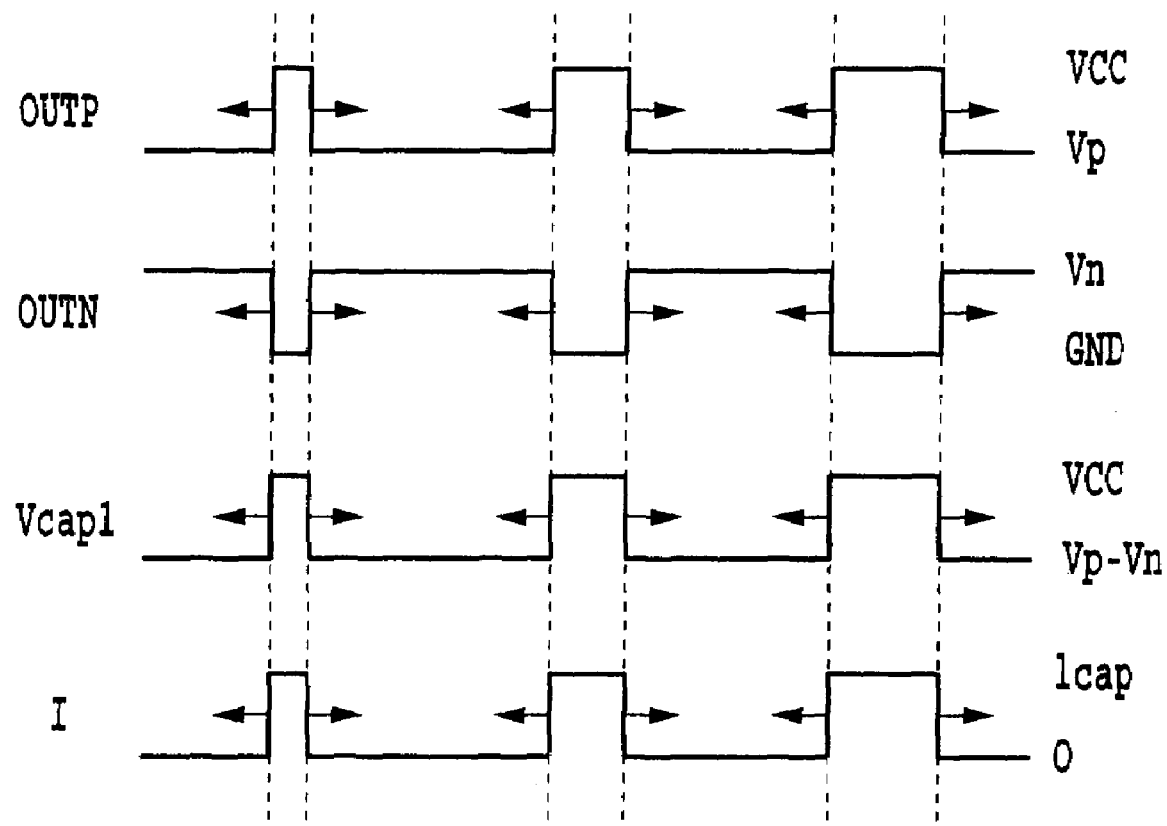
FIG. 9 is a waveform diagram showing outputs OUTP and OUTN, an output signal Vcap1 as a voltage across terminals, and a current I in the duration T2a of FIG. 8.

A timing 2-a of FIG. 9 corresponds to the operation of the driving circuit 10 during duration T2a of FIG. 8, i.e., corresponds to the load-driving states 1-a and 1-c in FIGS. 5 and 7, respectively.

Figure 10:
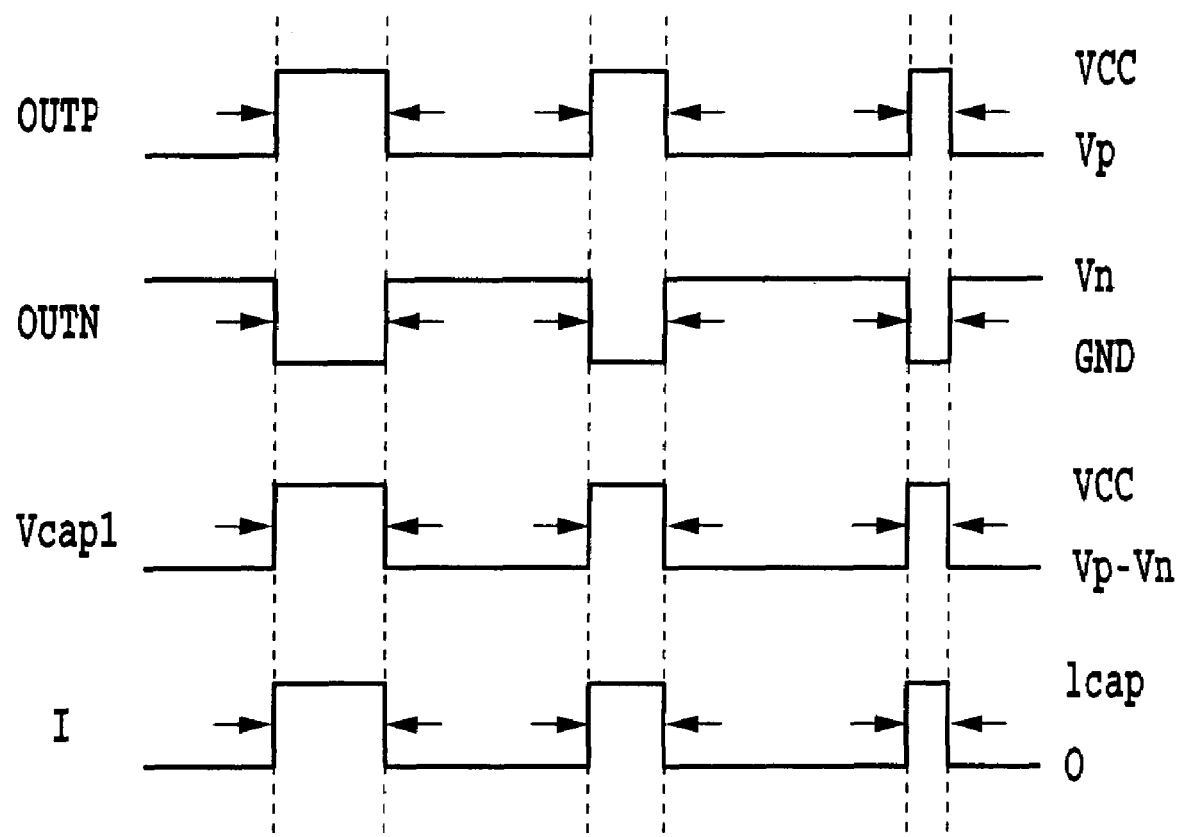
FIG. 10 is a waveform diagram showing the outputs OUTP and OUTN, the output signal Vcap1 as a voltage across terminals, and the current I in the duration T2b of FIG. 8.

A timing 2-b of FIG. 10 corresponds to the operation of the driving circuit 10 during duration T2b of FIG. 8, i.e., corresponds to the load-driving states 1-a and 1-c in FIGS. 5 and 7, respectively.

Figure 11:
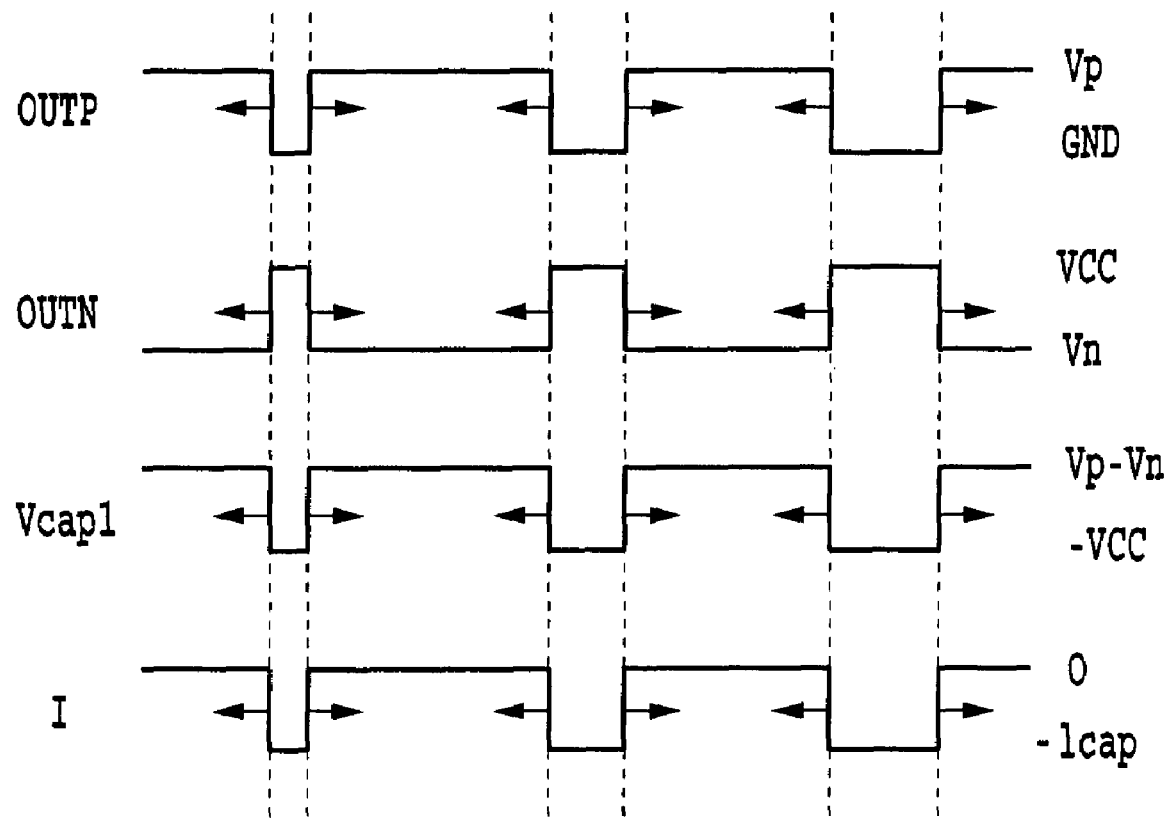
FIG. 11 is a waveform diagram showing the outputs OUTP and OUTN, the output signal Vcap1 as a voltage across terminals, and the current I in the duration T2c of FIG. 8.

A timing 2-c of FIG. 11 corresponds to the operation of the driving circuit 10, during duration T2c in FIG. 8, i.e., corresponds to the load-driving states 1-b and 1-c in FIGS. 6 and 7, respectively.

Figure 12:
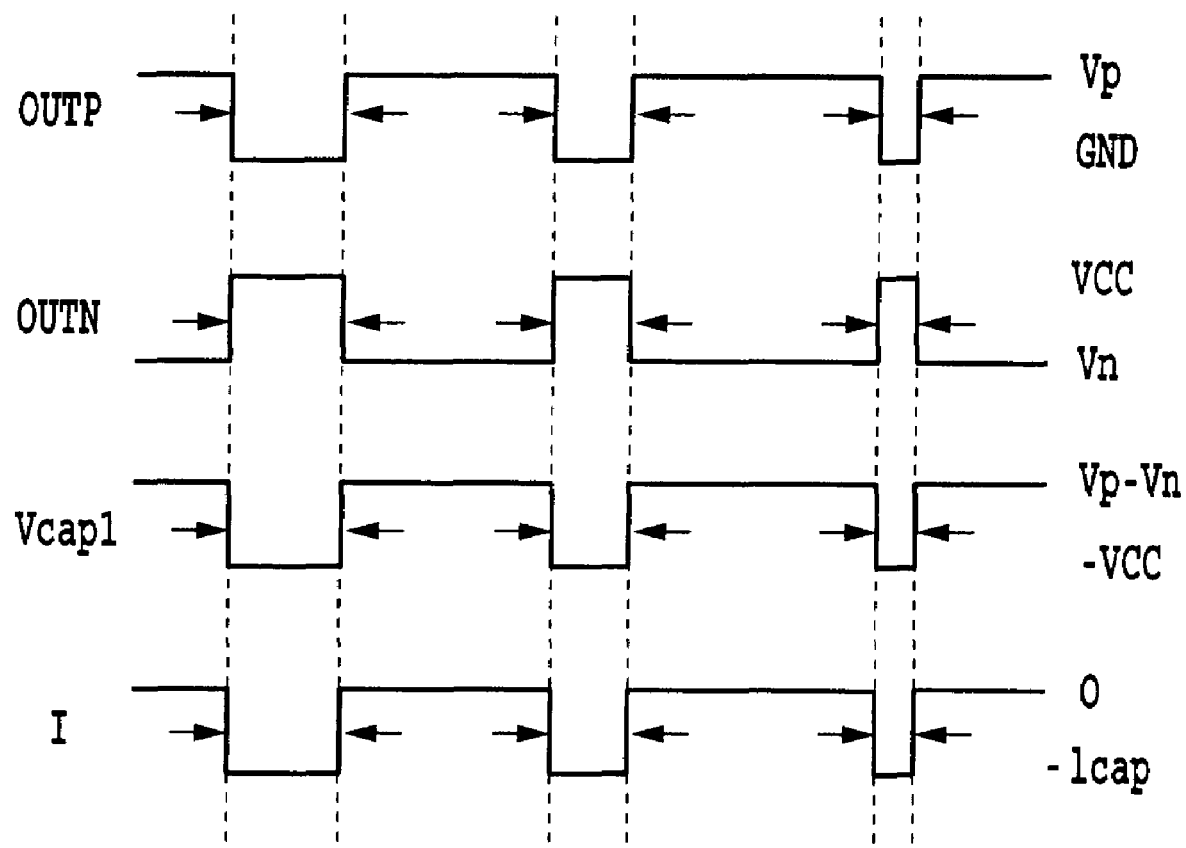
FIG. 12 is a waveform diagram showing the outputs OUTP and OUTN, the output signal Vcap1 as a voltage between terminals, and the current I in the duration T2d of FIG. 8.

A timing 2-d of FIG. 12 corresponds to the operation of the driving circuit 10, during duration T2d in FIG. 8, i.e., corresponds to the load-driving states 1-b and 1-c in FIGS. 6 and 7, respectively.

During the load-driving state 1-a of FIG. 5, the transistors 101 and 104 are turned ON and transistors 102 and 103 are turned OFF. OUTP becomes VCC-level and OUTN becomes GND-level. Thus, current I flows through the capacitive load C1 from OUTP to OUTN.

During the load-driving state 1-b of FIG. 6, the transistors 101 and 104 are turned OFF and transistors 102 and 103 are turned ON. OUTP becomes GND-level and OUTN becomes VCC-level. Thus, the current I flows through the capacitive load C1 from OUTN to OUTP.

During the load-driving state 1-c of FIG. 7, the transistors 101, 102, 103, and 104 are turned OFF, and OUTP and OUTN become floating. Thus, the energy charged in the capacitive load C1 is maintained. In this case, no current flows through the capacitive load C1.

<The First Error Suppression Signal>

The function of the first error suppression signal Vout1 will be explained.

In the case that the capacitive load C1 is driven, the more the difference between the output signal Vcap1 which is a voltage across the capacitive load C1 and the target electric potential of the Vcap1 is larger, the more larger current is supplied. When the output signal Vcap1 becomes close to the target electric potential, the supplied current needs to be reduced rapidly.

The switching amplifier as the driving device 1 inputs the outputs OUTP and OUTN of the driving circuit 10 through the low pass filters 14 and 15 as the first feedback circuits to the error suppression circuit 11. The loop gain including the gain of the differential amplification circuit 111 suppresses the error components between the input signal Vin and OUTP and the fed back signals. Therefore, as shown the waveforms at the timing 2-b of FIG. 10 corresponding to the duration T2b of FIG. 8 and the waveforms at the timing 2-d of FIG. 12 corresponding to the duration T2d of FIG. 8, when the output Vout1 of the error suppression circuit 11 becomes close to s positive or negative maximum level of amplitude, the output Vout1 transits to the signal reference level so as to rapidly reduce duty ratios of pulse modulation signals.

The pulse width modulation circuit 12 produce a driving signal that is optimal to drive the capacitive load C1 based on the output Vout1 of the error suppression circuit 11, thereby the driving circuit 10 can output a waveform having high reproducibility to the input.

The duration T2a of FIG. 8 is duration that Vcap10 transits from negative maximum level of amplitude to positive maximum level of amplitude.

In the transition duration T2a, when the absolute value of the amplitude of the first error suppression signal Vout1 outputted from the error suppression circuit 11 is large, as waveforms shown in the timing 2-a of FIG. 9, the pulse width modulation circuit 12 controls driving-circuit state in one clock period T. That is, the control is performed such that the ratio of the driving-circuit state 1-a of FIG. 5 corresponding to the duration T1 that electric power is supplied is made to be larger and the ratio of the driving-circuit state 1-c of FIG. 7 corresponding to the duration T2 that no electric power is supplied is made to be smaller.

As a result, energy is supplied only in the direction from OUTP of the capacitive load C1 to OUTN so that the electric potential at OUTP of the capacitive load C1 becomes higher than that at OUTN.

Next, the duration T2b of FIG. 8 is duration that Vcap10 is approaching positive maximum level of amplitude.

In the duration T2b of near positive maximum level of amplitude, the supply of electric power needs to be reduced. Therefore, when the absolute value of the amplitude of the first error suppression signal Vout1 outputted from the error suppression circuit 11 is small, as waveforms shown in the timing 2-b in FIG. 10, the pulse width modulation circuit 12 controls driving-circuit state in one clock period T. That is, the control is performed such that the ratio of the driving-circuit state 1-a of FIG. 5 corresponding to the duration T1 that electric power is supplied is made to be small and the ratio of the driving-circuit state 1-c of FIG. 7 corresponding to the duration T2 that no electric power is supplied is made to be large.

As a result, in the near positive maximum level of amplitude, the waveform of an input signal can be reproduced with high reproducibility. In the duration T2b, energy is supplied only in the direction from OUTP of the capacitive load C1 to OUTN.

Next, the duration T2c of FIG. 8 is duration that Vcap10 transits from positive maximum level of amplitude to negative maximum level of amplitude.

In the transition duration T2c, when the absolute value of the amplitude of the first error suppression signal Vout1 outputted from the error suppression circuit 11 is large, as waveforms shown in the timing 2-c of FIG. 11, the pulse width modulation circuit 12 controls driving-circuit state in one clock period T. That is, the control is performed such that the ratio of the driving-circuit state 1-b of FIG. 6 corresponding to the duration T1 that electric power is supplied is made to be large and the ratio of the driving-circuit state 1-c of FIG. 7 corresponding to the duration T2 that no electric power is supplied is made to be small.

As a result, energy is supplied only in the direction from OUTN of the capacitive load C1 to OUTP such that the electric potential at OUTP of the capacitive load C1 becomes lower than that at OUTN.

Next, the duration T2d in FIG. 8 is duration in which Vcap10 is approaching its negative maximal-amplitude level.

In the duration T2d of near negative maximum level of amplitude, the supply of energy needs to be reduced. Therefore, when the error amount in the amplitude of the first error suppression signal Vout1 outputted from the error suppression circuit 11 is small, as waveforms shown in the timing 2-d in FIG. 12, the pulse width modulation circuit 12 controls driving-circuit state in one clock period T. That is, the control is performed such that the ratio of the driving-circuit state 1-b of FIG. 6 corresponding to the duration T1 that electric power is supplied is made to be small and the ratio of the driving-circuit state 1-c of FIG. 7 corresponding to the duration T2 that no electric power is supplied is made to be large.

As a result, in the near negative maximum level of amplitude, the waveform of an input signal can be reproduced with high reproducibility. In the duration T2d, energy is supplied only in the direction from OUTN of the capacitive load C1 to OUTP.

Accordingly, by being controlled in accordance with the timing represented in FIGS. 8 to 12, the driving circuit 10 supplies energy only from the positive polarity of the capacitive load C1 during the duration that the output signal Vcap1 is positive. The driving circuit 10 supplies energy only from the negative polarity of the capacitive load C1 during the duration that the output signal Vcap1 is negative. Therefore, wasteful energy consumption can be suppressed, thus performing the drive of the capacitive load C1 having high reproducibility to input.

The terminal of output OUTP or output OUTN can directly be connected to the terminal of the capacitive load C1 without any intermediate. However, a resistor may be inserted between the output OUTP and the one terminal of the capacitive load C1 or between the output OUTN and the other terminal of the capacitive load C1, thus operating the driving circuit 10 under current limitation.

<Control in the Period T>

In FIG. 8, a case will be considered that it is assumed that one period of each of the switching control signals Vp1, Vp2, Vp3, and Vp4 is regarded as "T". These switching control signals are modulated based on the first error suppression signal Vout1 is "T". The one period "T" is divided into the duration T1 that electric power is supplied and the duration T2 that no electric power is supplied.

Figure 13:
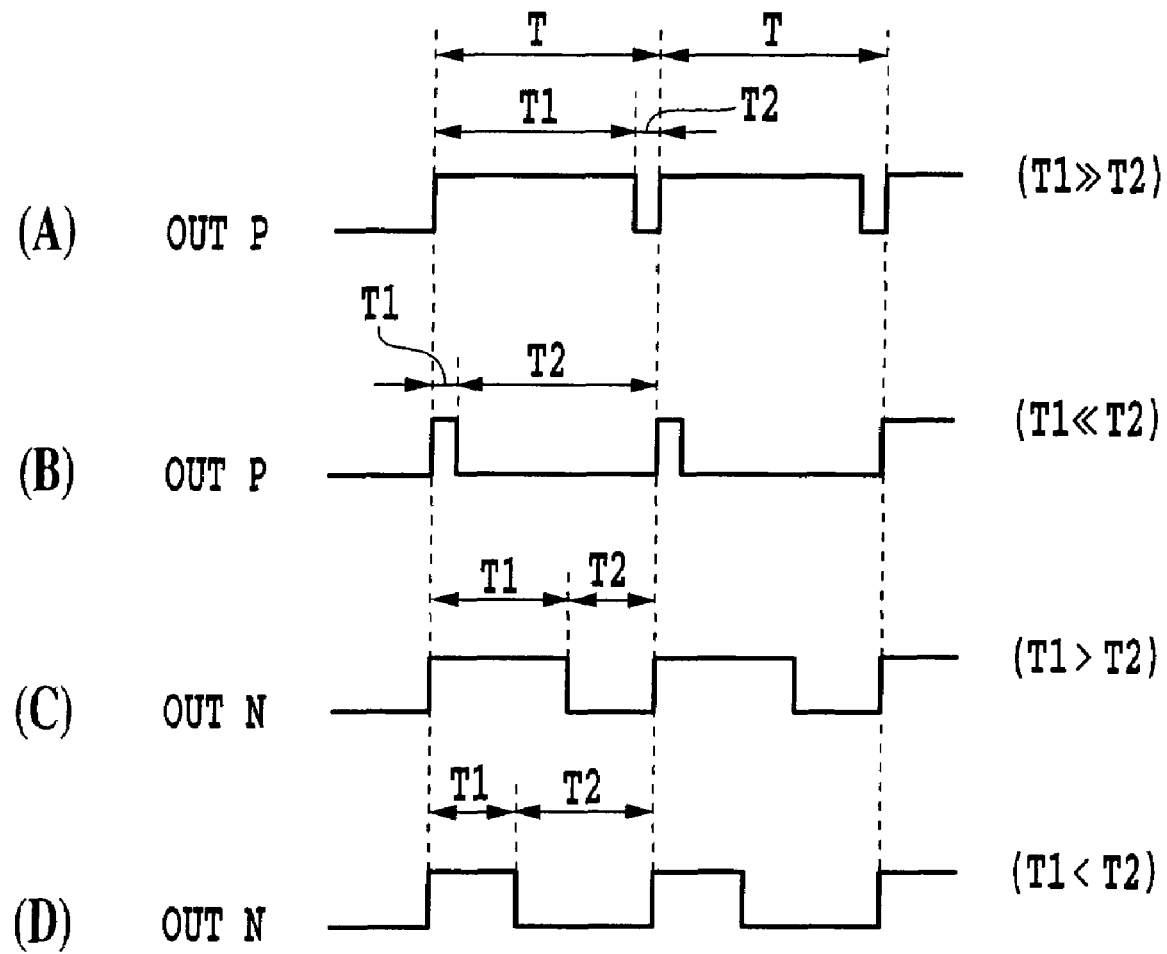
FIG. 13 is a timing chart that signal waveforms shown in FIGS. 9 to 12 as an example for comparison.

(A) to (D) of FIG. 13 are explanatory operation of the signal waveforms shown in FIGS. 9 to 12.

(A) of FIG. 13 is an example of the waveform of OUTP in FIG. 9 and corresponds to the duration T2a of FIG. 8.

(B) of FIG. 13 is an example of the waveform of OUTP in FIG. 10 and corresponds to the duration T2b of FIG. 8.

(C) of FIG. 13 is an example of the waveform of OUTN in FIG. 11 and corresponds to the duration T2c of FIG. 8.

(D) of FIG. 13 is an example of the waveform of OUTN in FIG. 12 and corresponds to the duration T2d of FIG. 8.

As shown in (A) and (C) of FIG. 13, when the absolute value of the amplitude of the first error suppression signal Vout1 is large in the durations T2a and T2c, the duty ratios of the switching control signals Vp1, Vp2, Vp3, and Vp4 are set so as to be large, thus performing the control of supplying electric power to the capacitive load C1.

As shown in (B) and (D) of FIG. 13, when the error of amplitude between signals in the case of producing the first error suppression signal Vout1 is small in the durations T2b and T2d, the duty ratios of the switching control signals Vp1, Vp2, Vp3, and Vp4 are set so as to be small, thus performing the control of supplying no electric power to the capacitive load C1.

As a result, a waveform of the output signal Vcap10, having high reproducibility to an input signal Vin can be outputted from the output terminals 50 and 51 of the capacitive load C1 in the driving device 1.

Moreover, the drive of load such as a capacitive piezoelectric speaker can be performed under low power consumption, thus improving power consumption in the driving circuit including load.

SECOND EXAMPLE

A second embodiment of the present invention will be explained with reference to FIGS. 14 to 16. In addition, with regard to the same constituent elements as those in the first embodiment, explanations therefor are omitted and the same reference characters are allocated therefor.

Figure 14:
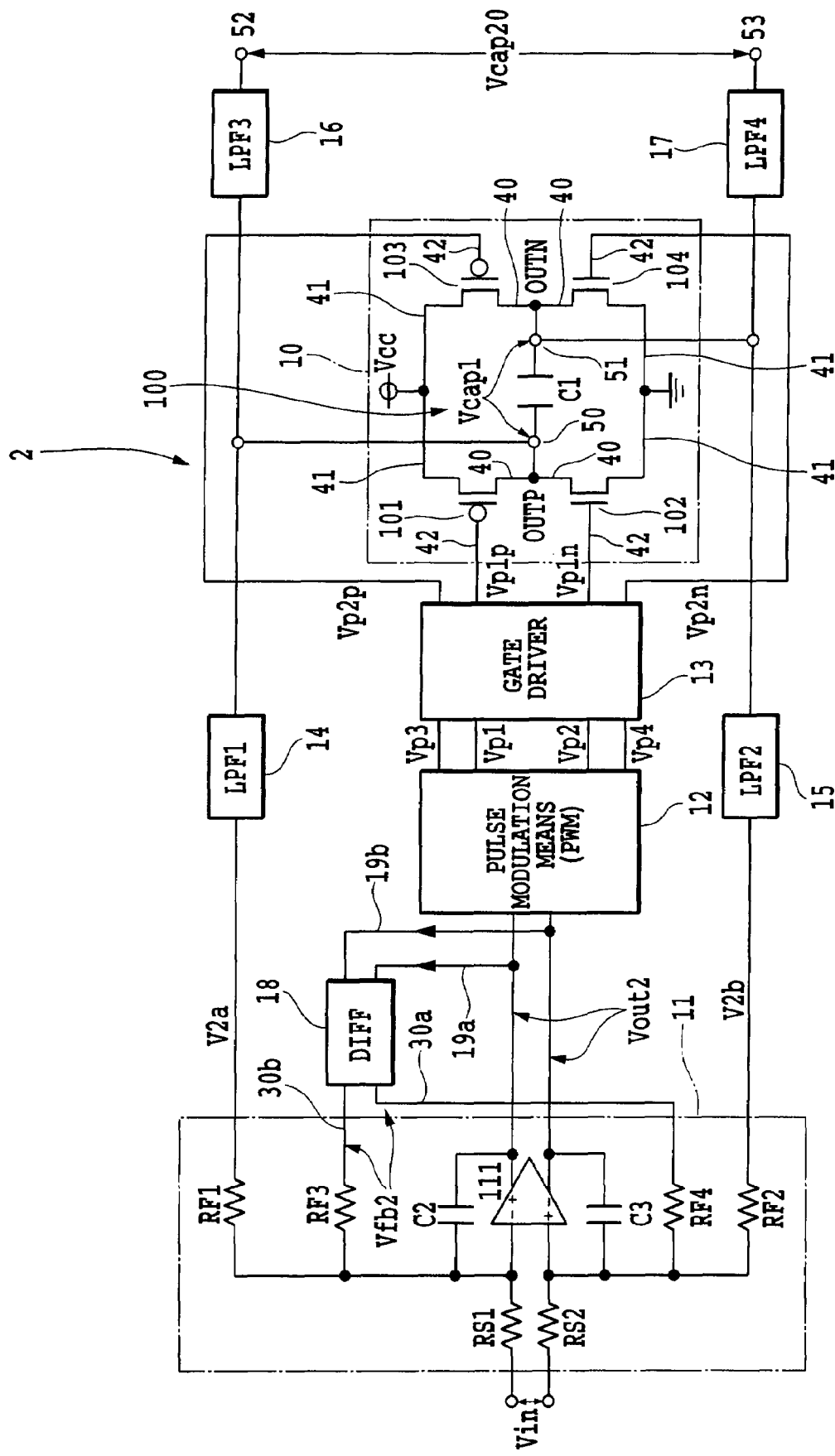
FIG. 14 is a circuit diagram showing an exemplary configuration of a driving device constituted of a switching amplifier, according to a second embodiment of the present invention.

A driving device 2 of FIG. 14 is a circuit diagram showing an example of driving device 1 shown in FIG. 1 having an arithmetic circuit 18 as a second feedback means.

The arithmetic circuit 18 is connected between the error suppression circuit 11 and the pulse width modulation circuit (PWM) 12. Connection lines 19a and 19b at the input side are branched from output lines that the first error suppression signal Vout1 is outputted from the error suppression circuit 11. Connection lines 30a and 30b at the output side are connected to respective resistors RF3 and RF4 in the error suppression circuit 11.

The arithmetic circuit 18 is a circuit for detecting the inclination of a signal. The configuration of the arithmetic circuit 18 is constituted of a differential circuit but is not limited thereto. Alternatively, for example, the arithmetic circuit 18 may be configured by a high pass filter having frequency components higher than a preset cut-off frequency.

After the arithmetic circuit 18 detects the inclination of the first error suppression signal Vout1 outputted from the error suppression circuit 11, a detection signal Vfb2 including the detected inclination as well as fed-back signals V2a and V2b is inputted to the error suppression circuit 11.

Then, the error suppression circuit 11 compares the inclination of the input signal V1n with the signals V2a and V2b including the inclination of the detection signal Vfb2 to produce a second error suppression signal Vout2 corresponding to the error of inclination between signals. In this case, the error suppression circuit 11 is configured as an integrator.

Figure 15:
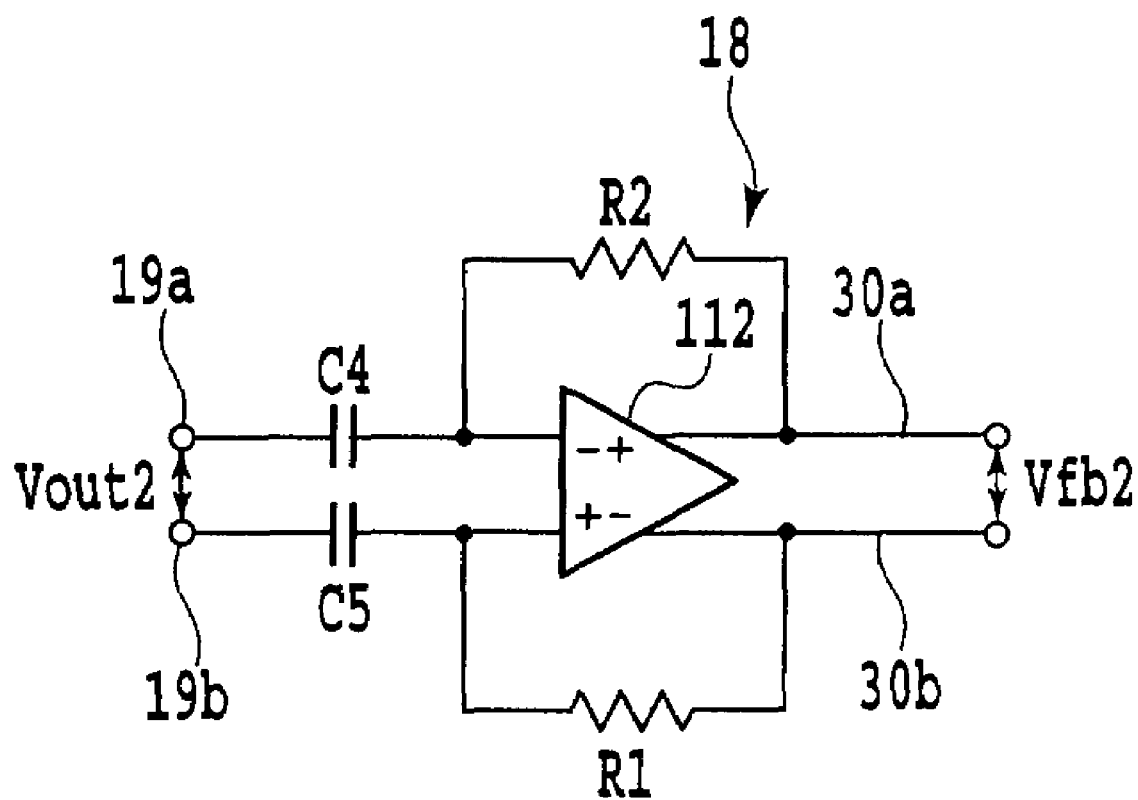
FIG. 15 is a diagram showing a differential circuit as an example of an arithmetic circuit.

FIG. 15 shows a differentiation circuit as an example of the arithmetic circuit 18. The arithmetic circuit 18 includes a differential amplification circuit 112, capacitors C4 and C5 connected between input terminals 19a and 19b and input terminals of the differential amplification circuit 112, and resistors R1 and R2 connected between output terminals 30a and 30b and input terminals of the differential amplification circuit 112. In this case, an inputted signal is differentiated to detect inclination, a differentiation signal including the detected inclination is outputted.

<Inclination>

The word "inclination" means a variation of the amplitude of voltage contrast to time change of continuous signal.

Figure 16:
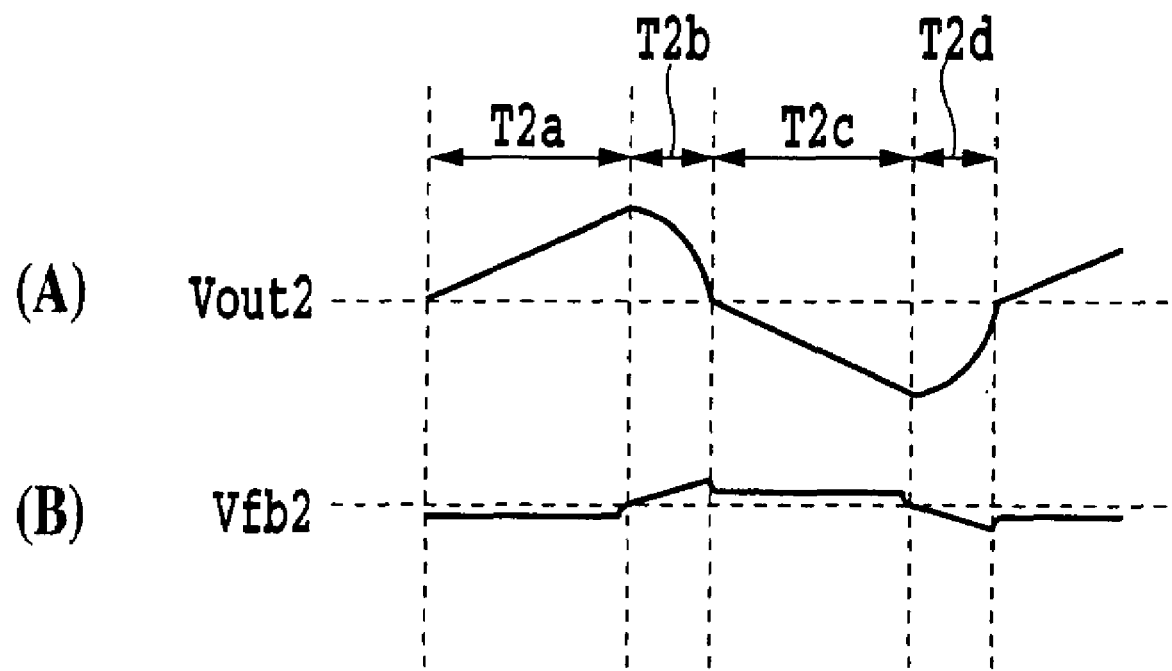
FIG. 16 is a waveform diagram showing a waveform produced by differentiating a waveform inputted to an arithmetic circuit.

(A) and (B) of FIG. 16 show waveforms produced by differentiating the waveform of a signal inputted to the arithmetic circuit 18.

The detection signal Vfb2 indicates variation in the inclination of the second error suppression signal Vout2 and output is varied largely when the inclination varies sharply. The error suppression circuit 11 outputs the second error suppression signal Vout2 so as to suppress such a variation.

In FIG. 16, a component including sharp variation is inputted to the integrator to decrease the amplitude of Vout2, and thus a sharp component of output waveform can be smoothed.

<The Second Error Suppression Signal>

The function of the second error suppression signal Vout2 will be explained.

Figure 17:
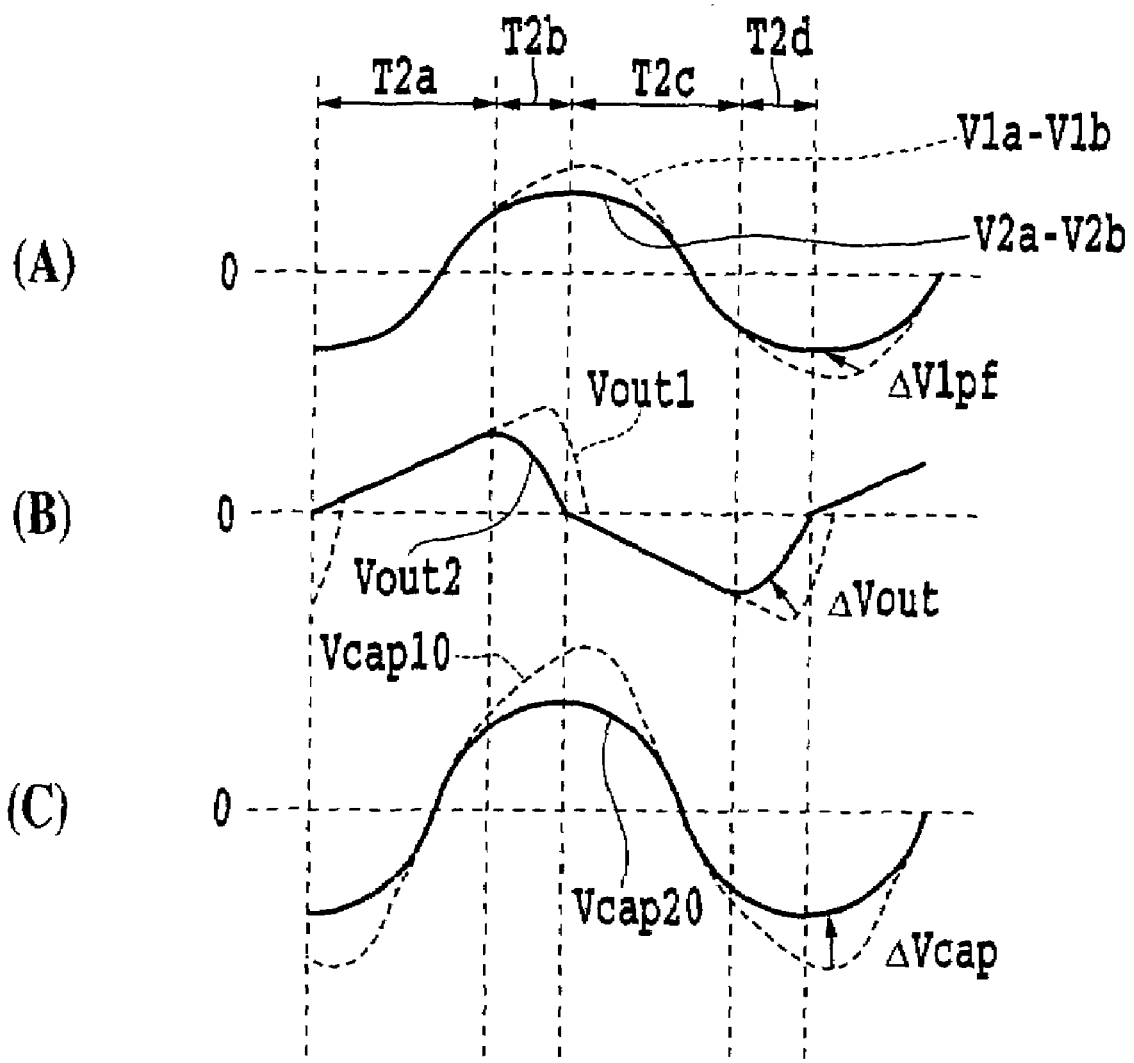
FIG. 17 is a waveform diagram showing waveforms of signals produced by the circuit of a driving device.

(A) to (C) of FIG. 17 are charts showing respective waveforms of signals produced by the circuit of driving device 1.

In the driving device 1 of FIG. 1, the output signal Vcap1 from the driving circuit 10 is inputted to the low pass filters 14 and 15 as feed-back circuits. Then, the signals V1a and V1b are inputted to the first error suppression circuit 11. Thus, the first error suppression signal Vout1 that error components contrast to the input signal are suppressed can be produced due to the loop gain including the gain of the differential amplification circuit 111.

When becoming near to the positive or negative maximum level of amplitude of signal waveform, the produced first error suppression signal Vout1 transits to the signal reference level so as to rapidly reduce the duty ratios of the switching control signals Vp1, Vp2, Vp3, and Vp4 as pulse-modulated signals. However, the error components that cannot completely be suppressed by the first error suppression circuit 11 exist a little as an inclination error near the maximum level of amplitude.

The inclination-error components included in the first error suppression signal Vout1 is produced mainly due to high-frequency components.

Accordingly, in this example, the first error suppression signal Vout1 including the high-frequency components is routed to a differentiation circuit such as the arithmetic circuit 18. The detection signal Vfb2 including an inclination component is inputted through the feedback resistors RF3 and RF4 to the error suppression circuit 11.

In the error suppression circuit 11, the signals V2a and V2b fed back through the low pass filters 14 and 15 are added to the detection signal Vf2b including the inclination and the added value are inputted to input terminals of the differential amplification circuit 111.

In this case, as shown in (A) of FIG. 17, the corrected fed back output signals V2a and V2b become the value with corrected $\Delta V1pf$ according to the error of inclination between signals relative to signals V1a and V1b.

As shown in (B) of FIG. 17, the error suppression circuit 11 compares the input signal Vin with the output signals V2a and V2b including the inclination component of the detection signal Vfb2 and then produces the second error suppression signal Vout2 with corrected $\Delta$Vout such that the error of inclination between signals is suppressed.

As a result, as shown in (C) of FIG. 17, an output signal Vcap20 with corrected $\Delta$Vcap according to the error of inclination between signals relative to the output signal Vcap10 can be outputted.

In the first example, the first feedback is fed back to the error suppression circuit 11 such that the driving circuit 10 outputs a waveform having high reproducibility to an input. In contrast, as shown in FIG. 14, the arithmetic circuit 18 as the second feedback means is provided. Then, correction processing of a signal is performed based on the second error suppression signal Vout2 to improve distortion in a waveform. As a result, the reproducibility to an input signal can further be enhanced.

In FIG. 17, the phase relationship between a distorted waveform and a corrected waveform is ignored so as to facilitate understanding for the effect of improvement regarding distortion in the waveform. The actual corrected waveform is ahead contrast to the distorted waveform because a differential signal is added to the corrected waveform.

THIRD EXAMPLE

A third embodiment of the present invention will be explained with reference to FIG. 18. Note that, with regard to the same constituent elements as those in the first and second embodiments described above, explanations are omitted and the same reference characters are allocated.

This example shows an information apparatus including the driving device 1 of FIG. 1 or FIG. 14.

Figure 18:
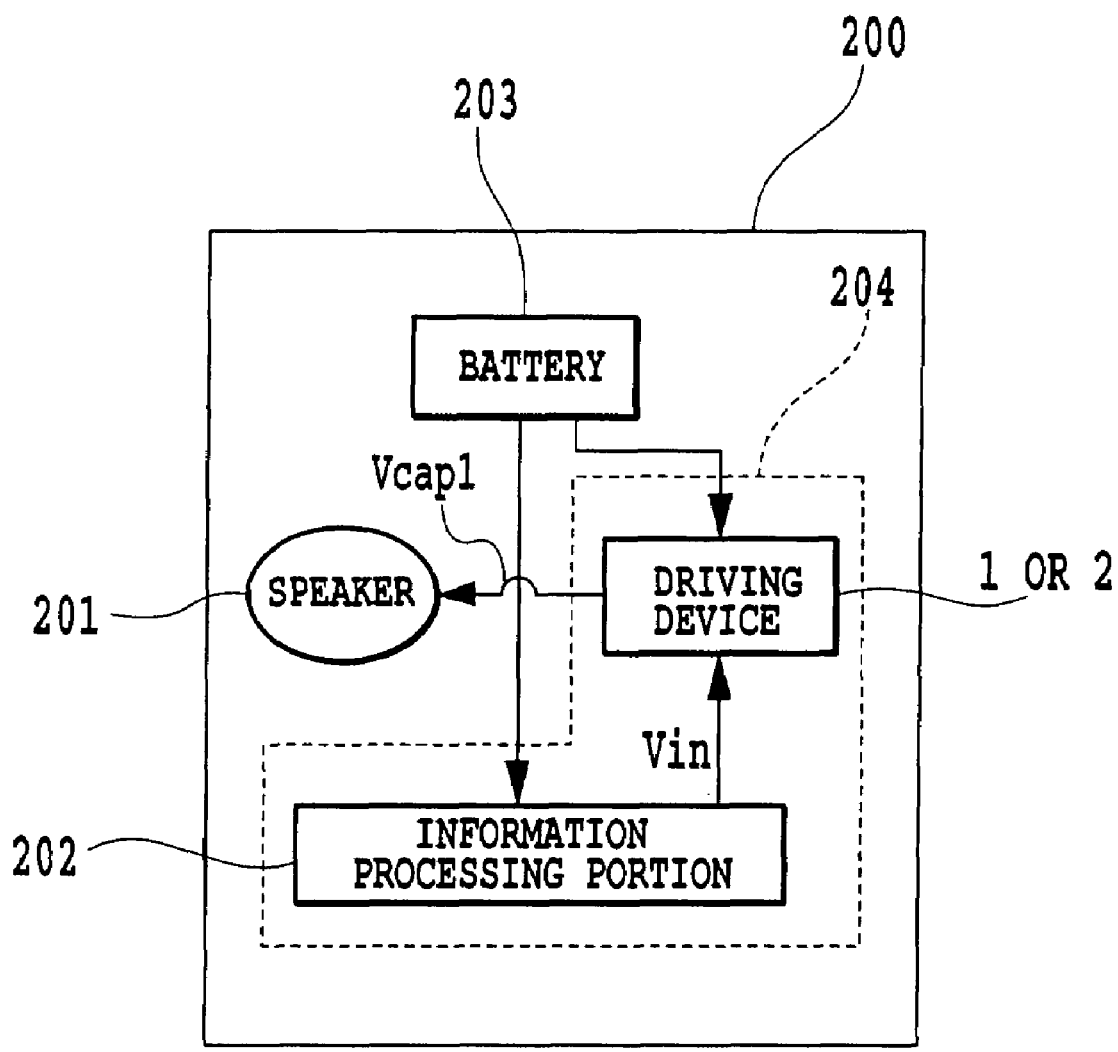
FIG. 18 is a block diagram showing an exemplary configuration of an information apparatus comprised of a mobile information terminal, such as a mobile telephone, according to a third embodiment of the present invention.
Figure 19:
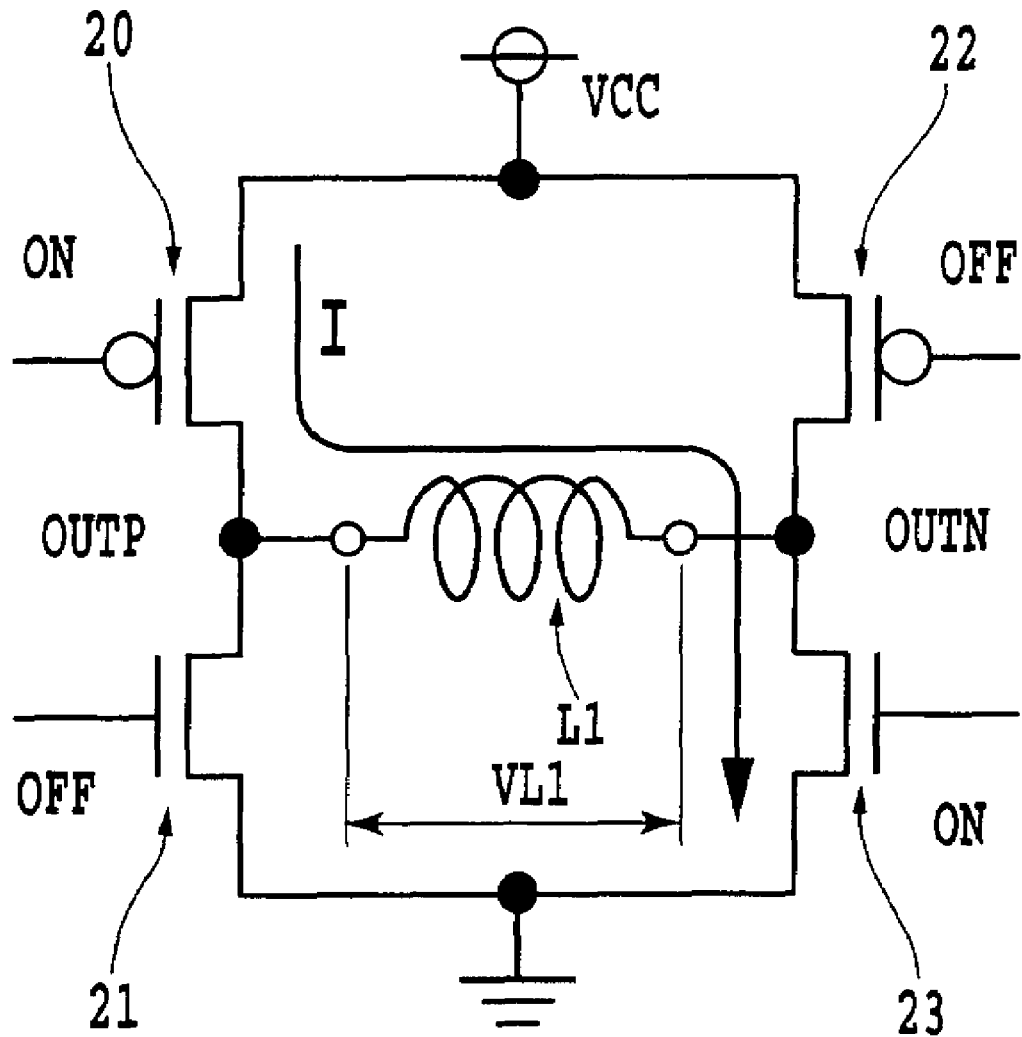
FIG. 19 is a circuit diagram showing a load-driving state in an ON condition by using an inductive load of a conventional switching amplifier.
Figure 20:
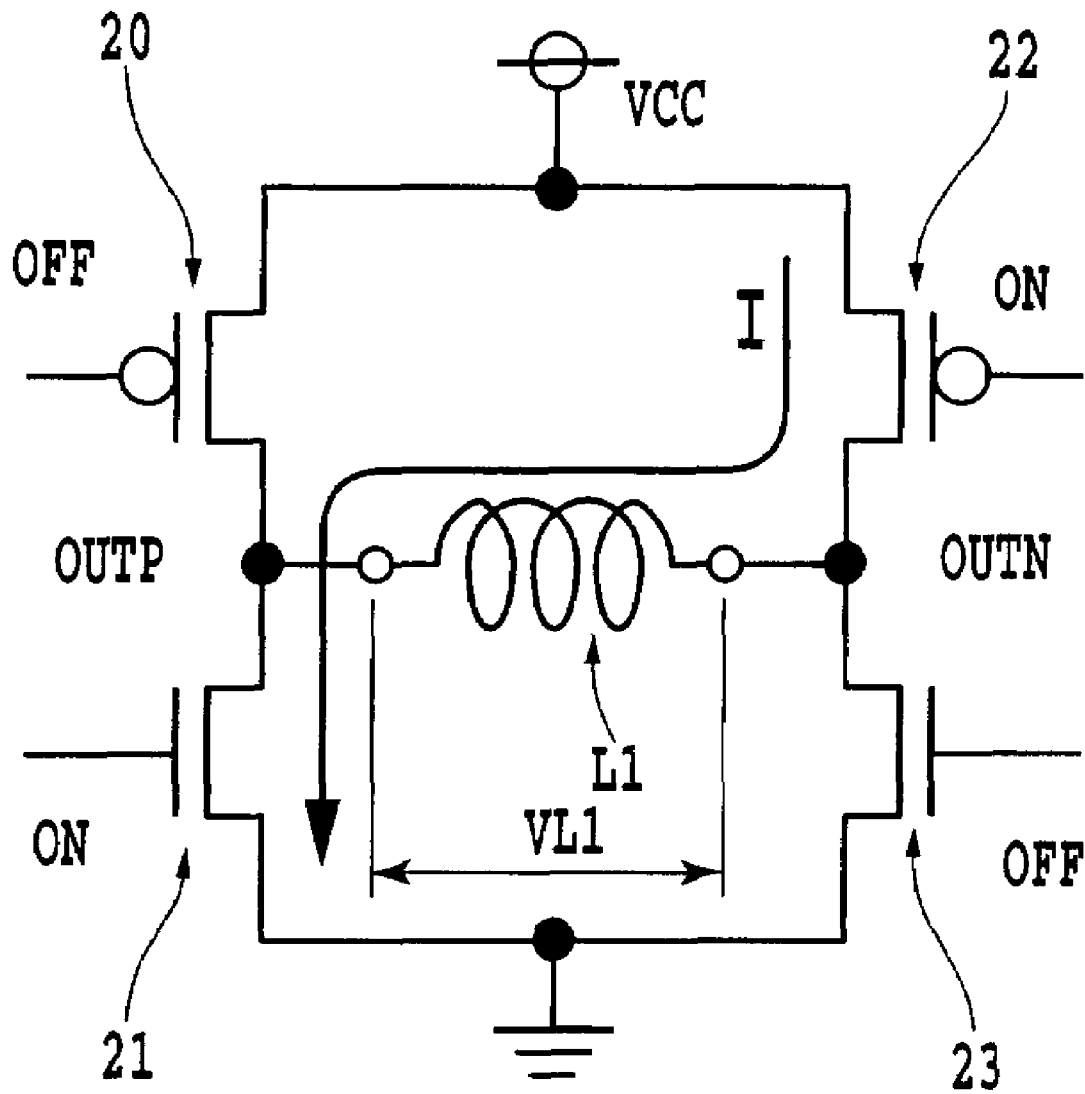
FIG. 20 is a circuit diagram showing a load-driving state in an ON condition by using an inductive load of a conventional switching amplifier.
Figure 21:
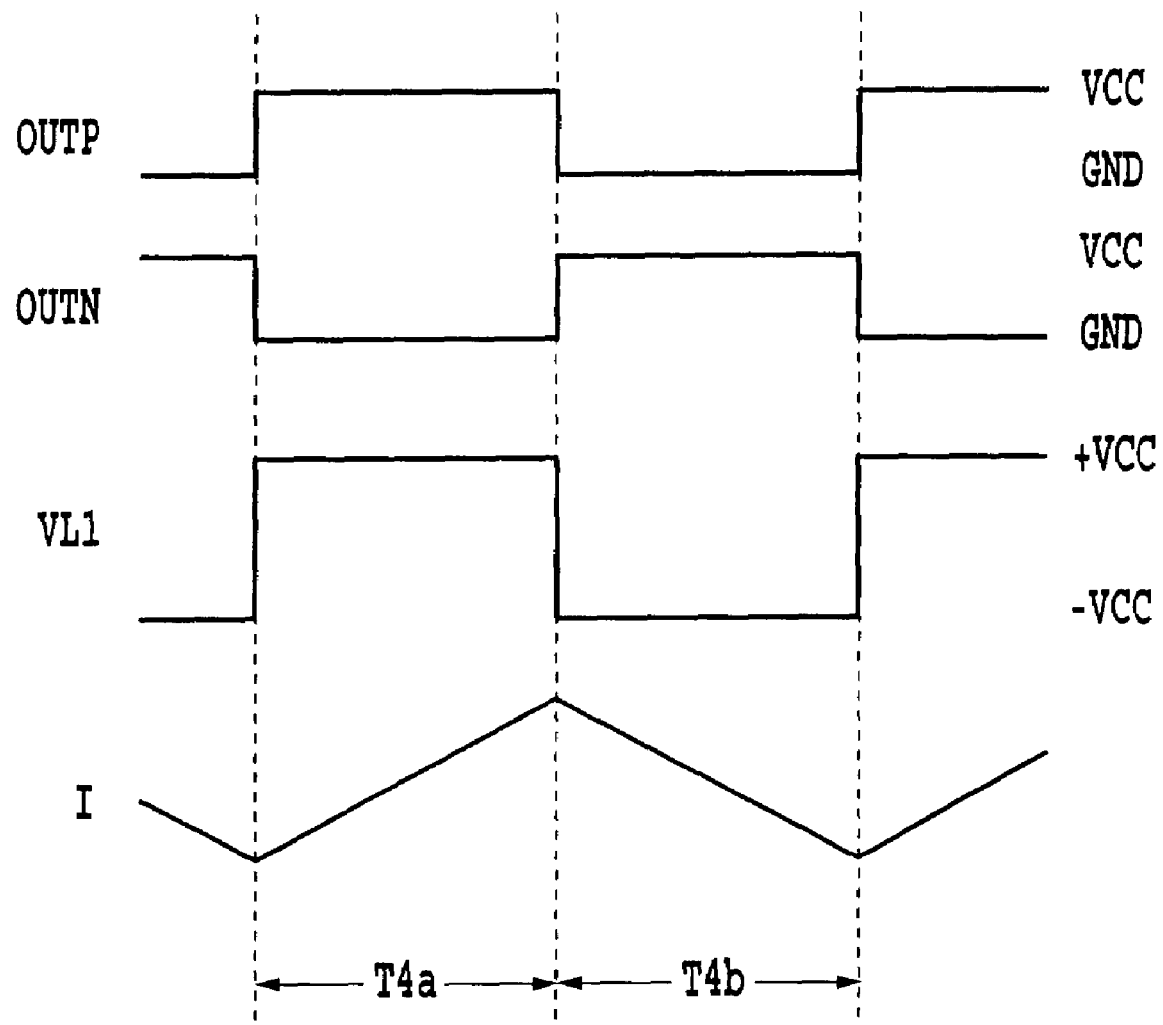
FIG. 21 is a waveform diagram showing respective signals in the driving circuit shown in FIGS. 19 and 20, in the case that the duty ratio of a pulse modulation output is 50%.
Figure 22:
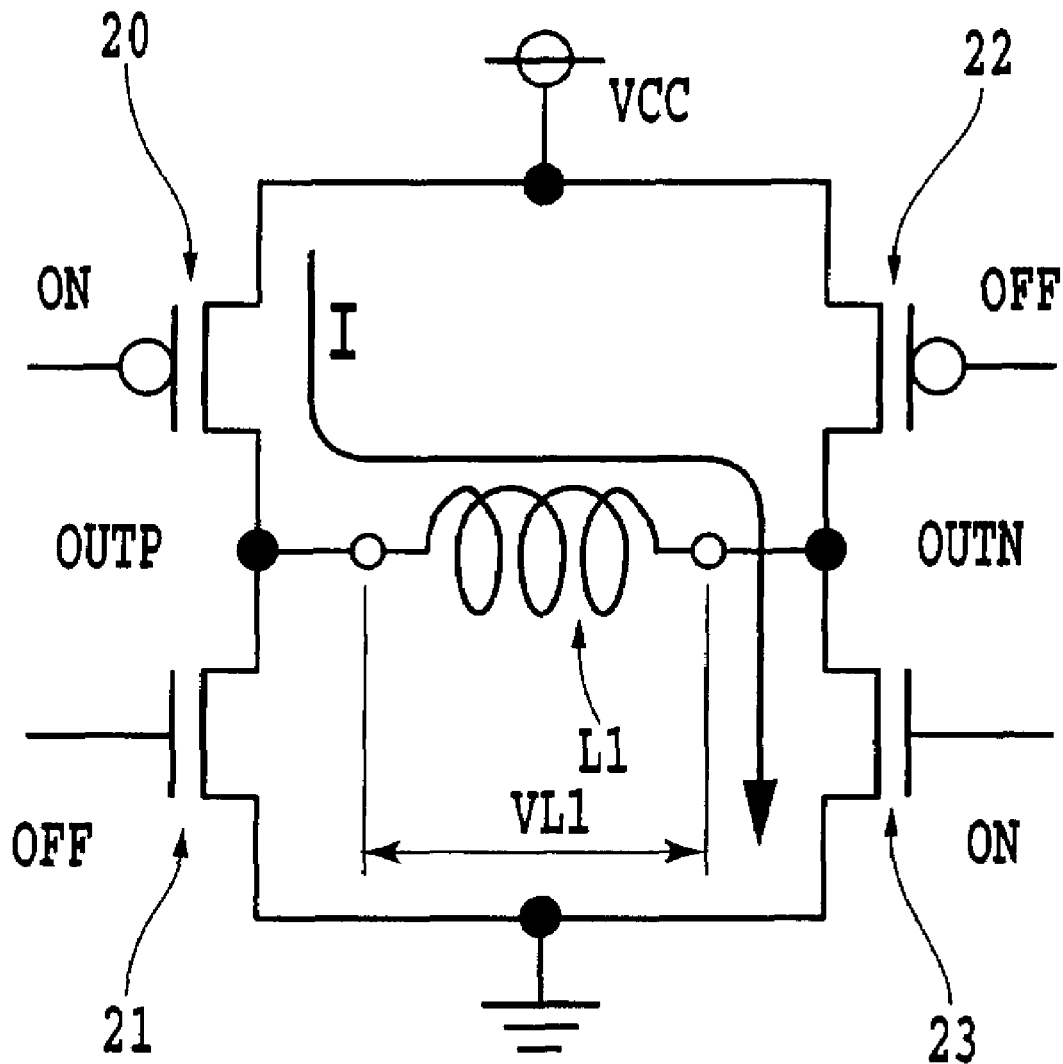
FIG. 22 is a circuit diagram explaining the path that current flows through an inductive load in a conventional driving state during an ON condition.
Figure 23:
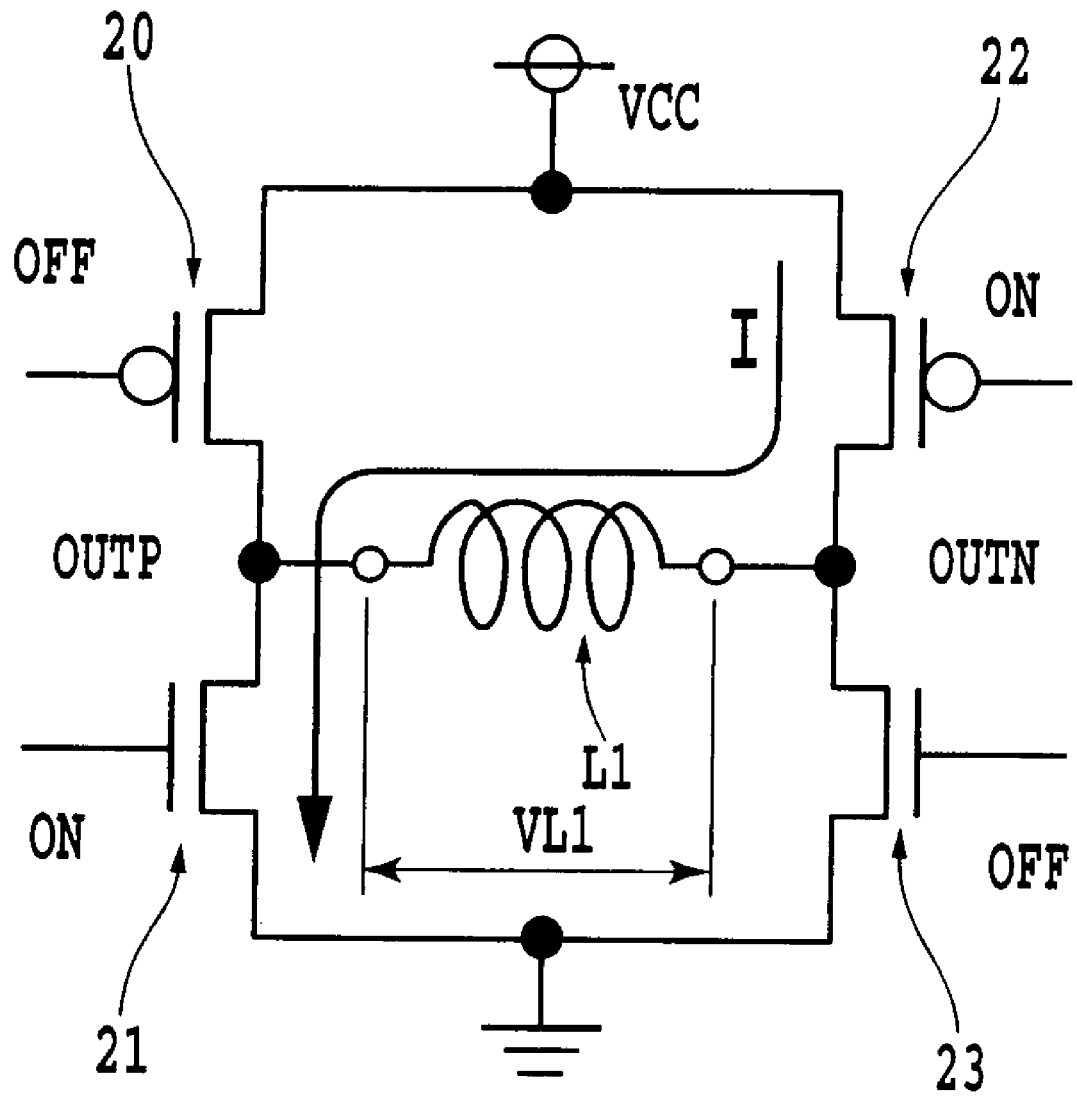
FIG. 23 is a circuit diagram explaining the path that current flows through an inductive load in the reverse direction contrast to a conventional driving state during the ON condition of FIG. 22.
Figure 24:
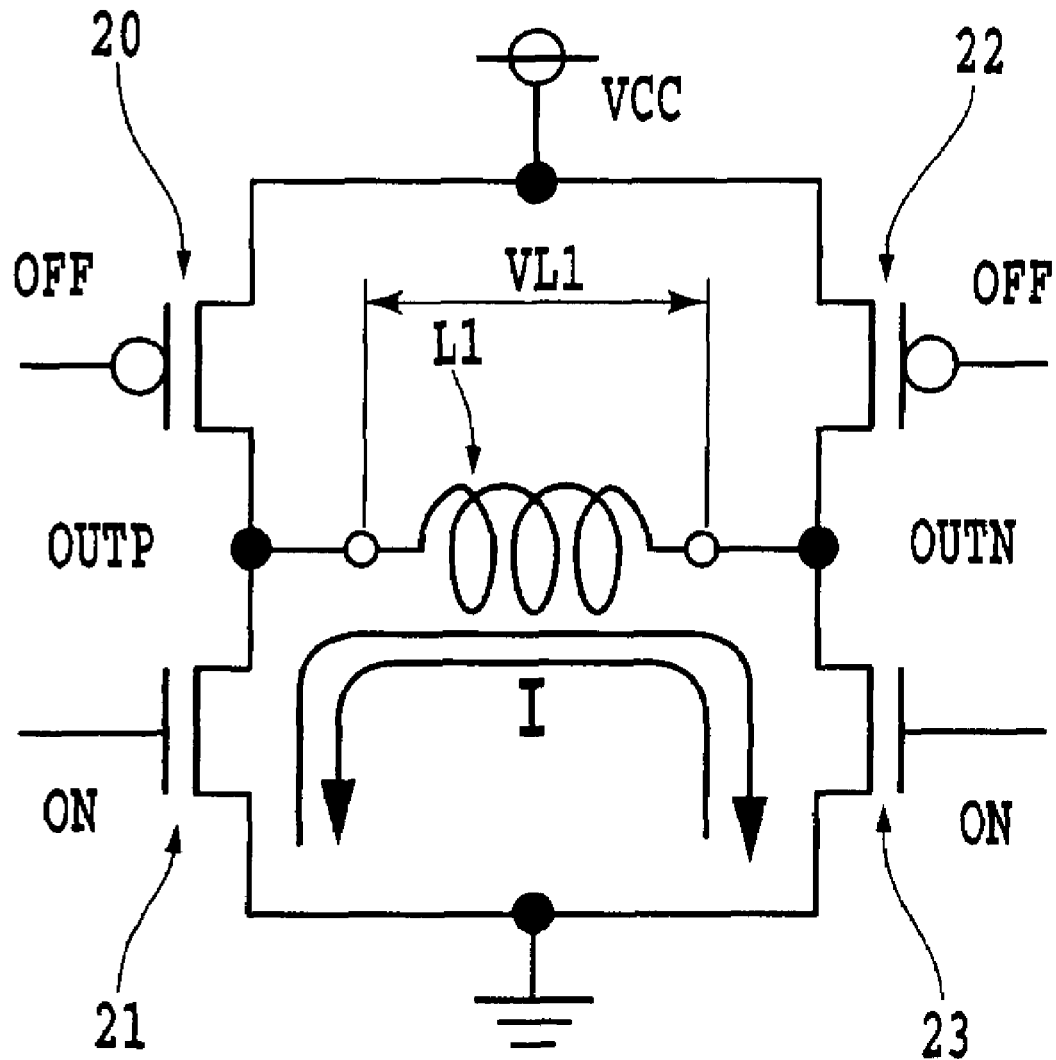
FIG. 24 is a circuit diagram explaining a case that current flows through an inductive load in a closed circuit at the ground side in a floating-state of a conventional driving circuit.
Figure 25:
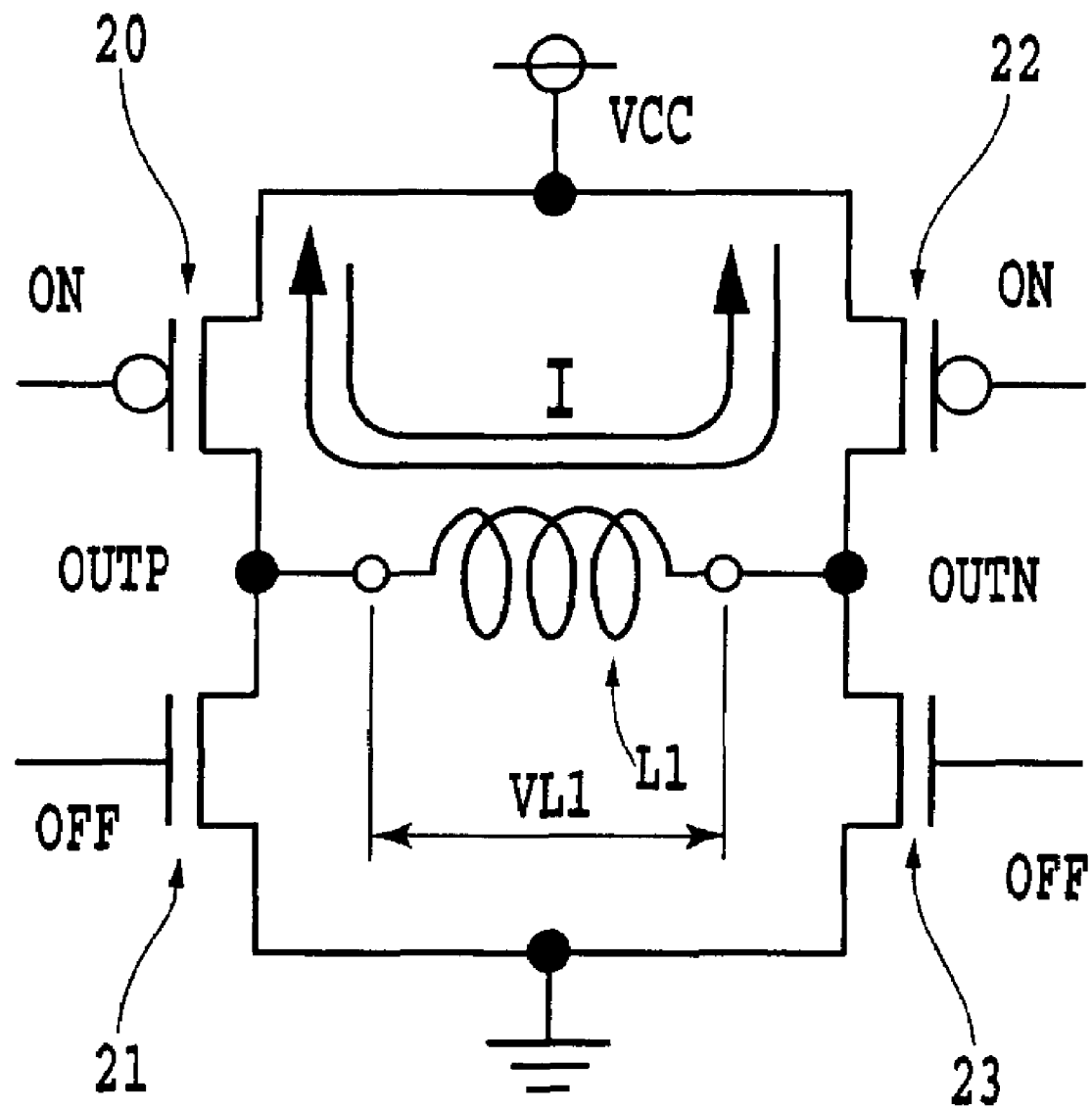
FIG. 25 is a circuit diagram explaining a case that current flows through an inductive load in a closed circuit at the power source side in a floating-state of a conventional driving circuit.
Figure 26:
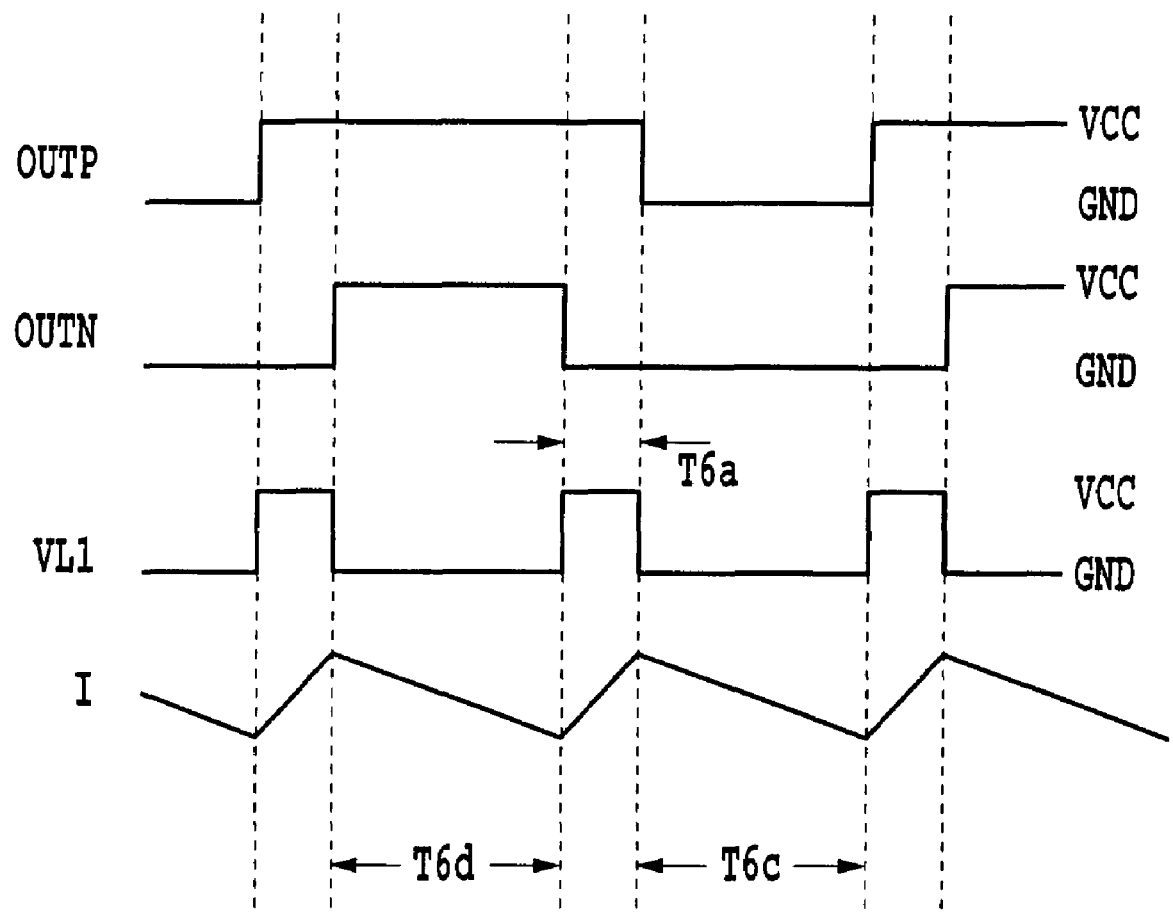
FIG. 26 is a waveform diagram showing signals of the driving circuit shown in FIGS. 22 to 25.
Figure 27:
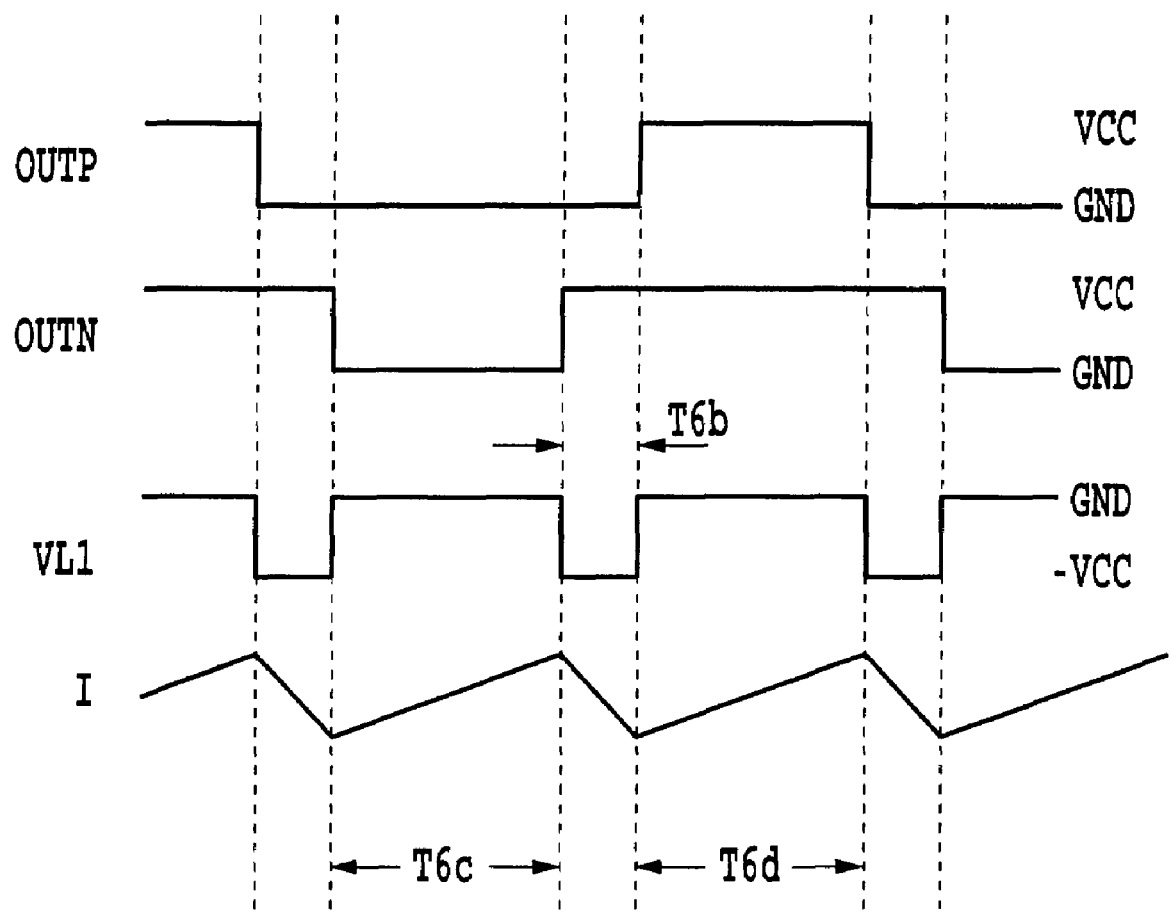
FIG. 27 is a waveform diagram showing signals of the driving circuit shown in FIGS. 22 to 25.

FIG. 18 shows the configuration of an information apparatus including a mobile information terminal 200 such as a mobile telephone.

The mobile information terminal 200 has a speaker 201 such as a piezoelectric speaker as a capacitive load, the driving device 1 of FIG. 1 or the driving device 2 of FIG. 14 for driving the speaker, an information processing portion 202 having a communication function, an information processing function and an operation processing function, and a battery 203 for supplying the driving device 1 or the driving device 2 and the information processing portion 202 with electric power. The information processing portion 202 outputs the input signal Vin to the driving device 1 or the driving device 2. The driving device 1 or the driving device 2 outputs the output signal Vcap1 to the speaker 201 based on the input signal Vin, thereby supplying the speaker 201 with electric power. The driving device 1 or the driving device 2 and the information processing portion 202 may be integrated as an LSI 204. The speaker 201 may be a dynamic speaker as inductive load.

The driving device 1 has a function for setting the first duration T1 that electric power is supplied and the second duration T2 that no electric power is supplied and the load is made floated, and a function for altering the proportion of the duration T1 to the duration T2 according to the first error suppression signal Vout1 or the second error suppression signal Vout2. Therefore, when the speaker is driven, a connection between terminals of the speaker is not short-circuited during duration that the electric charge is maintained. Thus, loss of the stored electric charge and decrease in the voltage across terminals can be prevented. As a result, a waveform of the output signal having high reproducibility to an input signal can be outputted.

Moreover, in the power-supply duration next to the duration that electric charge is lost, electric charge corresponding to the lost electric charge is not additionally supplied to compensate the lost electric charge. Then, electric power is not consumed overly. Therefore, reactive power is not produced, thereby reducing reactive power and performing low power consumption.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A driving device for controlling electric power to a load by using switching elements, the driving device comprising:
a driving means having a switching circuit including the switching elements connected to the load;
a control means for controlling switching operations of the switching elements, wherein the control means sets a first duration that electric power is supplied to the load and a second duration that the load is floated without electric power;
a first feedback means for feeding back an output signal across output terminals of the load to an input terminal inputted an input signal; and
an error suppression means, connected to the input terminal, comparing the output signal fed back through the first feedback means with the input signal to detect an error between signals and producing an error suppression signal that the error is corrected, wherein the control means controls the operation of the switching elements in the driving means based on the error suppression signal.

2. A driving device according to claim 1, wherein
each of the switching elements has a first terminal connected to any one of terminals of the load, a second terminal to which a switching control signal is inputted, and a third terminal connected to a power-source terminal or a ground terminal;
the control means, within one period of the switching control signal, has the first duration that electric power is supplied to the load such that one terminal of the load is connected to the power-source terminal and the other terminal of the load is connected to the ground terminal, and the second duration that no electric power is supplied to the load such that terminals of the load are floated.

3. A driving device according to claim 1, wherein
each of the switching elements has a first terminal connected to any one of terminals of the load, a second terminal to which a switching control signal is inputted, and a third terminal connected to a power-source terminal or a ground terminal,
the control means, within one period of the switching control signal, has the first duration that electric power is supplied to the load such that one terminal of the load is connected to the power-source terminal and the other terminal of the load is connected to the ground terminal, and
the second duration that no electric power is supplied to the load such that one terminal of the load is connected to the power-source terminal or the ground terminal and the other terminal of the load is floated.

4. A driving device according to claim 1, wherein in accordance with the absolute value of the error suppression signal, the control means alters a proportion of the first duration that electric power is supplied to the load and the second duration that the load is floated without electric power.

5. A driving device according to claim 1, wherein the control means supplies electric power only from a positive-polarity output terminal of the load during a duration that the polarity of an output signal at output terminals of the load is positive, and supplies electric power only from a negative-polarity output terminal of the load during a duration that the polarity of the output signal is negative.

6. A driving device according to claim 1, wherein the control means includes:
a triangular-wave generation means producing a triangular wave;
a comparing means comparing the triangular wave with the error suppression signal; and
a control signal generation means producing a control signal for controlling the driving means based on output from the comparing means.

7. A driving device according to claim 1, further comprising:
a second feedback means for detecting an inclination component of a signal outputted from the error suppression means and feeding back the inclination component to an input terminal of the error suppression means, wherein the error suppression means compares the input signal with a combination signal that an output signal fed back through the first feedback means is added to the inclination component fed back through the second feedback means to detect an error between signals, and produces an error suppression signal that the error is corrected.

8. A driving device according to claim 1, wherein the driving means is directly connected to the load.

9. A driving device according to claim 1, wherein the load is a capacitive load.

10. A driving device according to claim 1, wherein the load is a piezoelectric speaker.

11. A driving method controlling electric power to a load by using a driving means having a switching circuit including switching elements connected to the load, the method comprising the steps of:

controlling switching operations of the switching elements, wherein the step of controlling includes the step of setting a first duration that electric power is supplied to the load and a second duration that the load is floated without electric power;

feeding back an output signal across output terminals of the load to an input terminal inputted an input signal by using a first feedback means; and comparing the output signal fed back through the first feedback means with the input signal to detect an error between signals and producing an error suppression signal that the detected error is corrected by using an error suppression means connected to the input terminal, wherein the operation of the switching elements in the driving means is controlled based on the error suppression signal.

12. A driving method according to claim 11, wherein a proportion of the first duration that electric power is supplied to the load to the second duration that the load is floated without electric power is altered.

13. A driving method according to claim 11, wherein electric power is supplied only from a positive-polarity output terminal of the load in a duration that the polarity of an output signal at terminals of the load is positive, and electric power is supplied only from a negative-polarity output terminal of the load in a duration that the polarity of the output signal is negative.

14. A driving device according to claim 1, further comprising:

a resistor inserted between the driving means and the load.

15. An information apparatus, the apparatus comprising:

the driving device according to claim 1 for controlling electric power to a load by using switching elements;

an information processing portion, having a communication function and an information processing, for controlling the driving device; and a battery supplying electric power to the driving device and the information processing portion.

* * * * *